US009576078B2

(12) United States Patent
Backos

(10) Patent No.: US 9,576,078 B2
(45) Date of Patent: Feb. 21, 2017

(54) METHODS OF GENERATING AN INTERIOR SURFACE OF A VEHICLE COMPARTMENT

(75) Inventor: Tasie N. Backos, Shelby Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 1090 days.

(21) Appl. No.: 13/611,417

(22) Filed: Sep. 12, 2012

(65) Prior Publication Data

US 2014/0074437 A1 Mar. 13, 2014

(51) Int. Cl.
*G06F 17/50* (2006.01)

(52) U.S. Cl.
CPC ........... *G06F 17/50* (2013.01); *G06F 17/5095* (2013.01)

(58) Field of Classification Search
None
See application file for complete search history.

(56) References Cited

U.S. PATENT DOCUMENTS

| | | | | |
|---|---|---|---|---|
| 5,231,749 | A * | 8/1993 | Hutchison | 29/407.1 |
| 5,355,317 | A * | 10/1994 | Talbott et al. | 700/97 |
| 6,324,750 | B1 * | 12/2001 | Saunders et al. | 29/721 |
| 6,760,693 | B1 * | 7/2004 | Singh et al. | 703/8 |
| 7,079,114 | B1 * | 7/2006 | Smith et al. | 345/158 |
| 2003/0058259 | A1 | 3/2003 | Kawaguchi et al. | |
| 2004/0010398 | A1 * | 1/2004 | Noma et al. | 703/1 |
| 2005/0200623 | A1 * | 9/2005 | Smith et al. | 345/419 |
| 2006/0038832 | A1 * | 2/2006 | Smith et al. | 345/629 |
| 2006/0167630 | A1 * | 7/2006 | Noma et al. | 701/211 |
| 2007/0038422 | A1 * | 2/2007 | Wang et al. | 703/8 |
| 2007/0198230 | A1 * | 8/2007 | Wang et al. | 703/1 |
| 2012/0246903 | A1 * | 10/2012 | Strawn | 29/428 |
| 2012/0320034 | A1 * | 12/2012 | Baron et al. | 345/419 |

FOREIGN PATENT DOCUMENTS

CN 101517577 A 8/2009

OTHER PUBLICATIONS

Wilbert O. Galitz, Chapter 2 of The Essential Guide to User Interface Design: An Introduction to GUI Design Principles and Techniques, 3rd Edition, John Wiley & Sons, 2007, 27 pages.*

(Continued)

*Primary Examiner* — Omar Fernandez Rivas
*Assistant Examiner* — Robert Brock
(74) *Attorney, Agent, or Firm* — Quinn Law Group, PLLC

(57) ABSTRACT

The present disclosure provides methods of generating an interior surface of a vehicle compartment. A selection from the user is received for one of a plurality of identifiers of the general template and a selection from the user is received for a desired location of an exterior surface of a specific vehicle to associate general criteria for the selected one of the identifiers with exterior surface data of the selected desired location. Interior surface data of the selected desired location is determined as a function of the general criteria of the selected one of the identifiers and the exterior surface data of the selected desired location. The interior surface representing the interior surface data of the configuration of the specific vehicle corresponding to the general criteria of the selected one of the identifiers and the exterior surface data of the selected desired location is displayed on the display device.

20 Claims, 24 Drawing Sheets

(56) References Cited

OTHER PUBLICATIONS

Authors Unknown, Publication information and Table of Contents for the 2007 Galitz reference, Safari Books Online, retrieved from http://techbus.safaribooksonline.com/book/design/9780470053423 on Sep. 21, 2016; copyright page from Galitz, 3 pages.*

Blanco et al, Design Handbook, Chapter:Engineering Drawing and Sketching, http://pergatory.mit.edu/2.007/Resources/drawings/index.html as archived on Feb. 4, 2008, obtained from http://web.archive.org/web/20080204074941/http://pergatory.mit.edu/2.007/Resources/drawings/index.html#sectioning on Sep. 29, 2016, 15 pages.*

* cited by examiner

METHODS OF GENERATING AN INTERIOR SURFACE OF A VEHICLE COMPARTMENT

TECHNICAL FIELD

The present disclosure relates to methods of generating an interior surface of a vehicle compartment.

BACKGROUND

During development of a vehicle, full-sized replicas of the vehicle can be developed to illustrate how the vehicle will look inside and outside. One type of replica that can be utilized are clay models. Clay models take time and resources to create and if created, these models are often completed well into development of the vehicle. Furthermore, one clay model represents one vehicle design; therefore, another clay model has to be created to represent another vehicle design.

SUMMARY

The present disclosure provides a method of generating an interior surface of a vehicle compartment. A plurality of identifiers representing components of a generic vehicle are provided and general criteria for each of the identifiers of the generic vehicle also provided. Each of the general criteria is associated with the respective identifier to define a general template. The general template is stored in a memory of a host machine. Furthermore, exterior surface data of a configuration of a specific vehicle is stored in the memory of the host machine. A selection from a user is received for the exterior surface data of the configuration of the specific vehicle from the memory of the host machine. An exterior surface representing the selected exterior surface data of the configuration of the specific vehicle is displayed as a three-dimensional configuration on a display device. In addition, the general template, including the identifiers, is displayed on the display device. A selection from the user is received for one of the identifiers of the general template and a selection from the user is received for a desired location of the exterior surface of the specific vehicle to associate the general criteria for the selected one of the identifiers with the exterior surface data of the selected desired location. Interior surface data of the selected desired location is determined, via the host machine, as a function of the general criteria of the selected one of the identifiers and the exterior surface data of the selected desired location. The interior surface representing the interior surface data of the configuration of the specific vehicle corresponding to the general criteria of the selected one of the identifiers and the exterior surface data of the selected desired location is displayed on the display device.

The present disclosure provides another method of generating an interior surface of a vehicle compartment. A general template is stored in a memory of a host machine, with the general template including a plurality of identifiers representing components of a generic vehicle and the general template including general criteria for each of the identifiers of the generic vehicle. In addition, exterior surface data of a configuration of a specific vehicle is stored in the memory of the host machine. A selection is received from a user for the exterior surface data of the configuration of the specific vehicle from the memory of the host machine. An exterior surface representing the selected exterior surface data of the configuration of the specific vehicle as a three-dimensional configuration is displayed on a display device. In addition, the general template, including the identifiers, is displayed on the display device. A selection is received from the user for one of the identifiers of the general template and a selection is received from the user for a desired location of the exterior surface of the specific vehicle to associate the general criteria for the selected one of the identifiers with the exterior surface data of the selected desired location. Interior surface data of the selected desired location is determined, via the host machine, as a function of the general criteria of the selected one of the identifiers and the exterior surface data of the selected desired location. Furthermore, the interior surface representing the interior surface data of the configuration of the specific vehicle corresponding to the general criteria of the selected one of the identifiers and the exterior surface data of the selected desired location is displayed on the display device.

The detailed description and the drawings or Figures are supportive and descriptive of the disclosure, but the scope of the disclosure is defined solely by the claims. While some of the best modes and other embodiments for carrying out the claims have been described in detail, various alternative designs and embodiments exist for practicing the disclosure defined in the appended claims.

DETAILED DESCRIPTION

Figure 1:
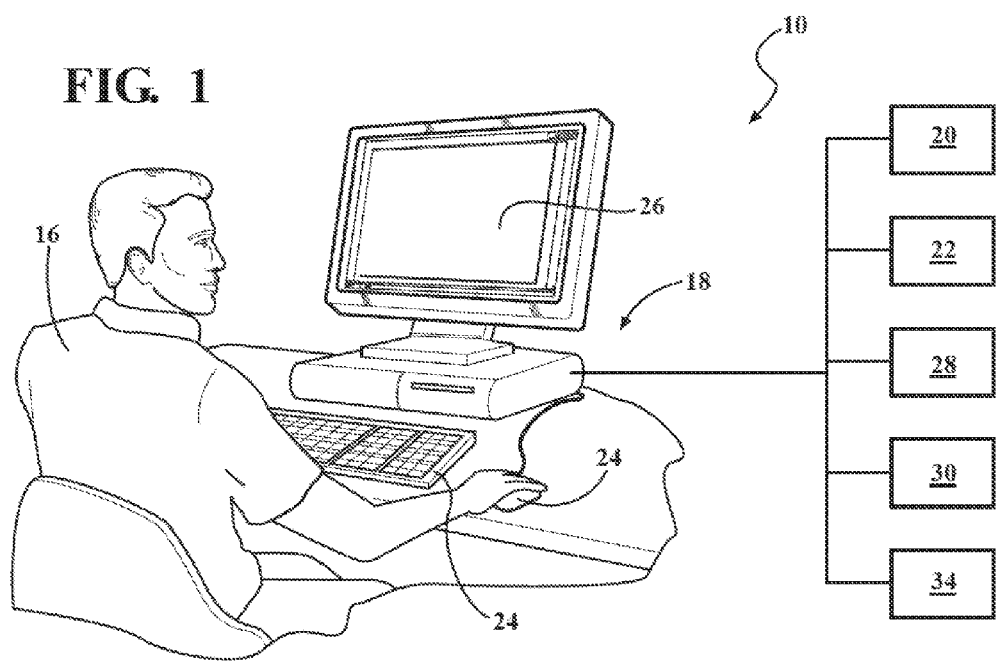
FIG. 1 is a schematic perspective view of a computer integrated system.
Figure 2:
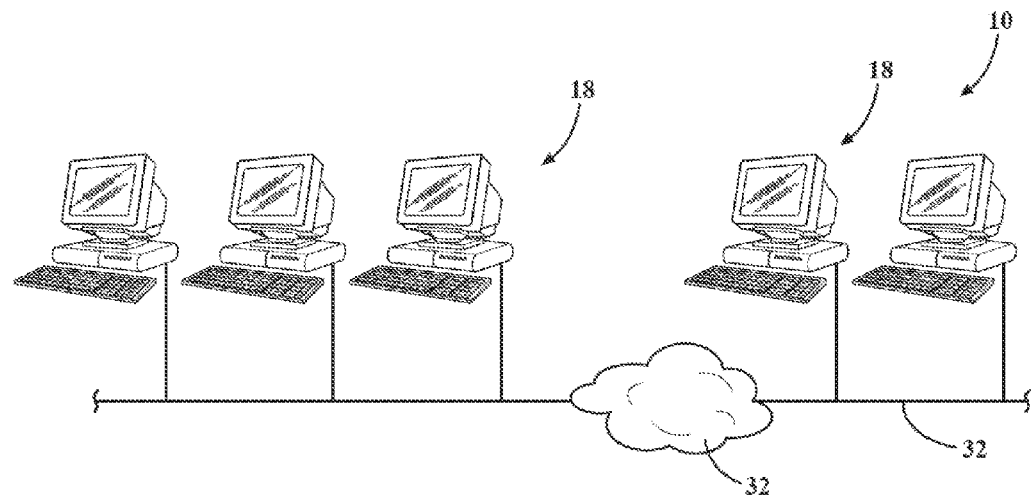
FIG. 2 is a schematic perspective view of a network for the computer integrated system of FIG. 1.
Figures 26, 27:
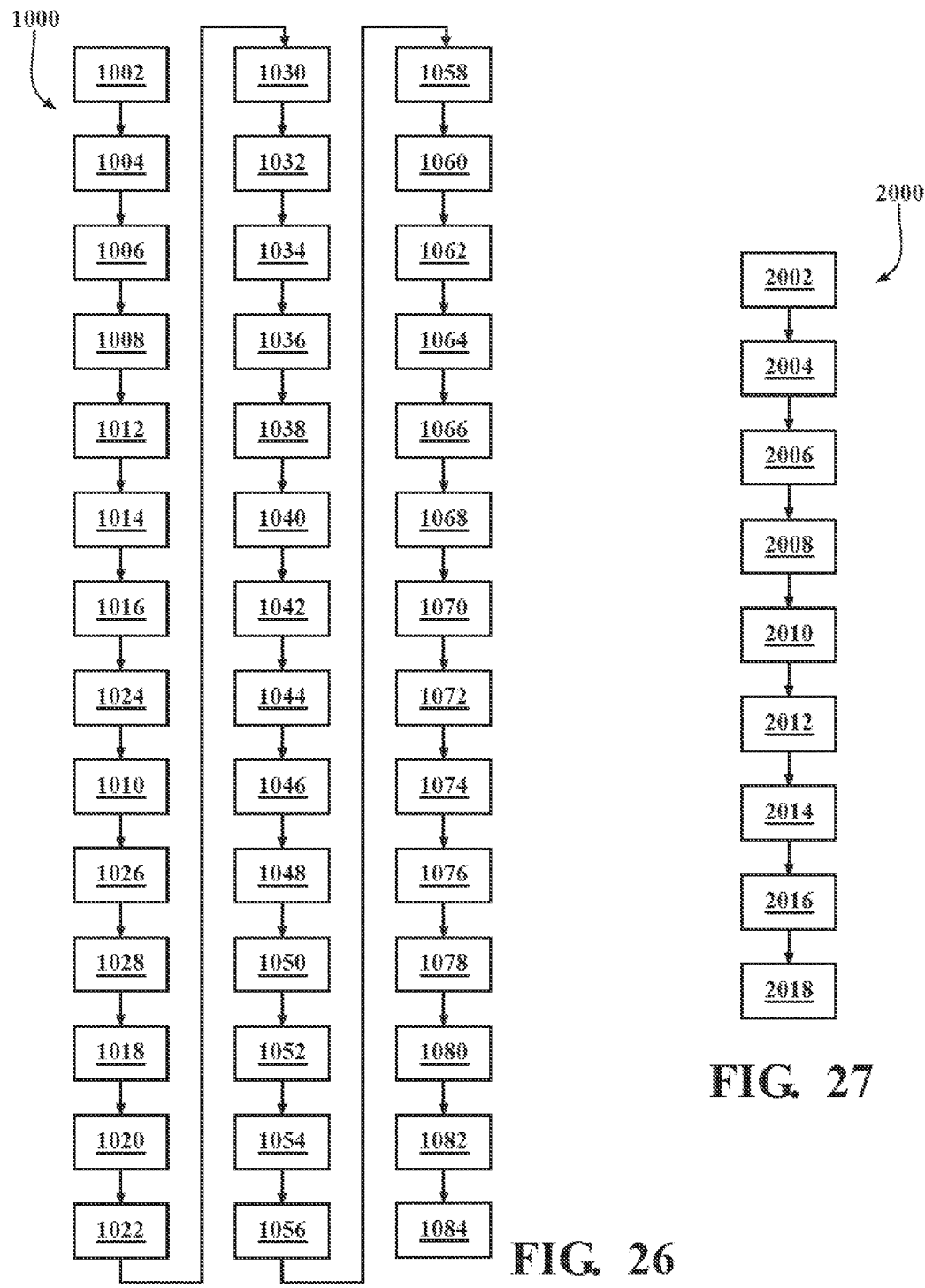
FIG. 26 is a schematic flowchart of a method of generating an interior surface of a vehicle compartment.
FIG. 27 is a schematic flowchart of another method of generating an interior surface of a vehicle compartment.

Referring to the Figures, wherein like numerals indicate like or corresponding parts throughout the several views, a computer integrated system 10 is generally shown in FIGS. 1 and 2. The computer integrated system 10 is configured to generate an interior surface 12 of a vehicle compartment 14 (see FIGS. 1 and 3). As such, the present disclosure provides methods 1000, 2000 of generating the interior surface 12 of the vehicle compartment 14, as shown in FIGS. 26 and 27. The methods 1000, 2000 provide a quick and easy way to generate the interior surface 12 without having to wait for a full-sized replica to be developed as discussed in the background section above. The methods 1000, 2000 will be discussed in detail below.

With regard to the computer integrated system 10, a user 16 or a plurality of users 16 can use the computer integrated system 10 to generate one or more interior surfaces 12, 134, 142 of one or more vehicle compartments 14, 144 of one or more vehicles. It is to be appreciated that interior surfaces 12, 134, 142 other than vehicle compartments 14, 144 can be generated by the methods 1000, 2000 described below.

Referring to FIG. 1, the computer integrated system 10 includes a host machine 18, such as a computer, etc., for the user 16 to interact with to generate the interior surface 12, 134, 142 of the vehicle compartment 14, 144. The host machine 18 selectively executes the methods 1000, 2000 for instance, by executing computer code or instructions recorded on tangible, non-transitory memory 20. The host machine 18 can include various elements such as a processor 22, an input 24, a display device 26, etc. The processor 22 can be commonly referred to as a central processing unit (CPU) which executes various commands, computations, etc. The input 24 can be further defined as a keyboard, a mouse, a touch screen, etc., and the display device 26 can be further defined as a screen, a monitor, etc.

The memory 20 can store one or more programs, etc. The memory 20 can take many forms, including, but not limited to, read only member (ROM), electrically-programmable read-only memory (EPROM), flash memory, etc. The host machine 18 can also include sufficient transitory memory, e.g., random access memory (RAM). Memory 20 can include one or more high-speed clocks, timers, analog-to-digital (A/D) circuitry, digital-to-analog (D/A) circuitry, a digital signal processor, and the necessary input/output (I/O) devices and other signal conditioning and/or buffer circuitry.

The host machine 18 can further include a medium reader 28 for reading the program, data, or other information from the memory 20. Also referring to FIG. 2, the host machine 18 can also include an interface device 30 that exchanges data with other host machines 18 via a network 32. In addition, the host machine 18 can include a graphical user interface 34 (GUI) which is a visual host machine environment that uses graphical images, such as icons, menus, dialog boxes, etc., to represent files, file folders, programs, and other options to enable the user 16 to access data via the network 32. Optionally, the GUI 34 can include the display device 26.

Generally, the user 16 selects the desired program, which is displayed on the display device 26, to begin to generate the interior surface 12, 134, 142 of the vehicle compartment 14, 144. In certain embodiments, the program utilized to generate the interior surface 12, 134, 142 is commercially available under the trade name Unigraphics from Siemens PLM Software of Plano, Tex. It is to be appreciated that any suitable program can be utilized to generate the interior surface 12, 134, 142 of the vehicle compartment 14, 144.

Figure 3:
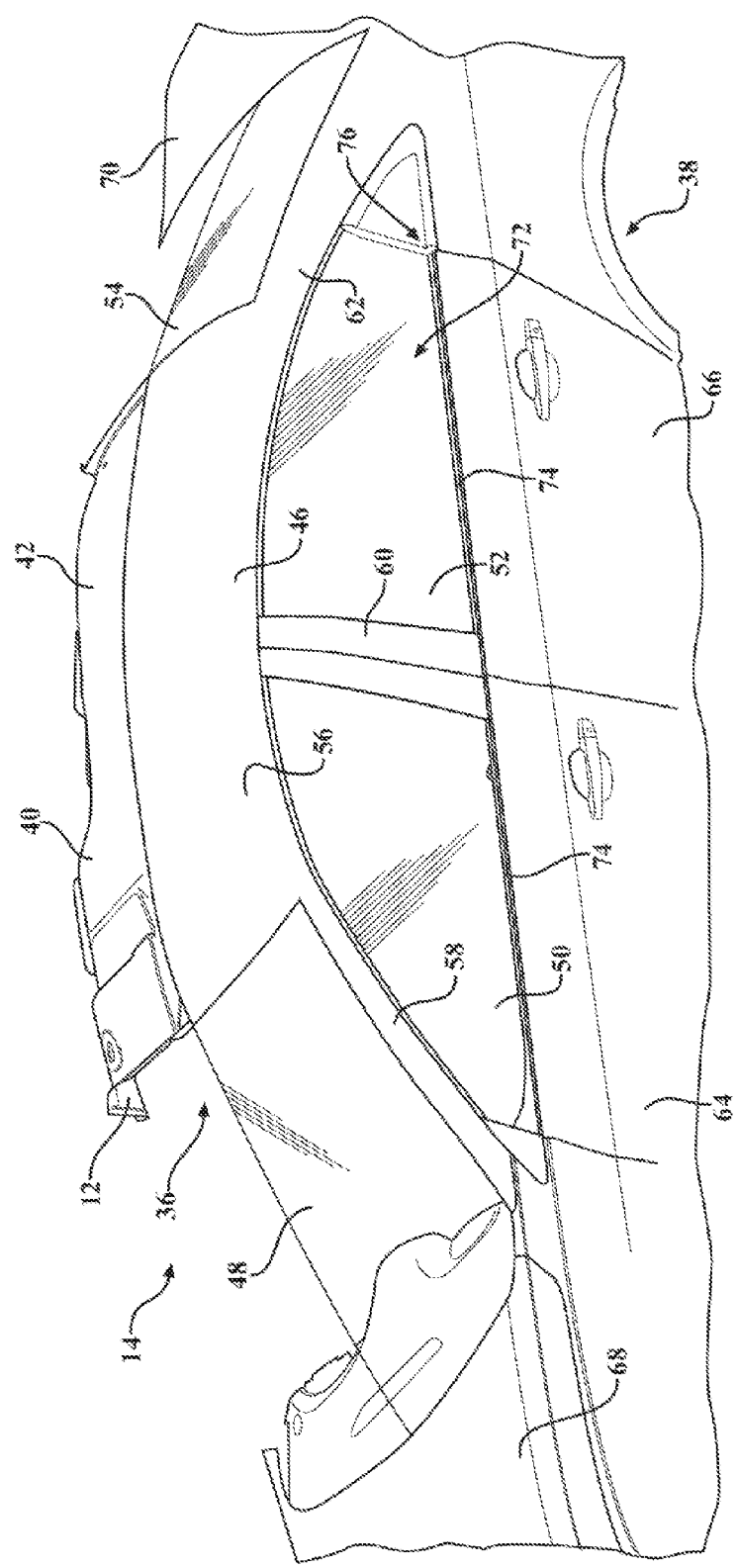
FIG. 3 is a schematic perspective view of a first specific vehicle and an interior surface of a vehicle compartment.
Figure 4:
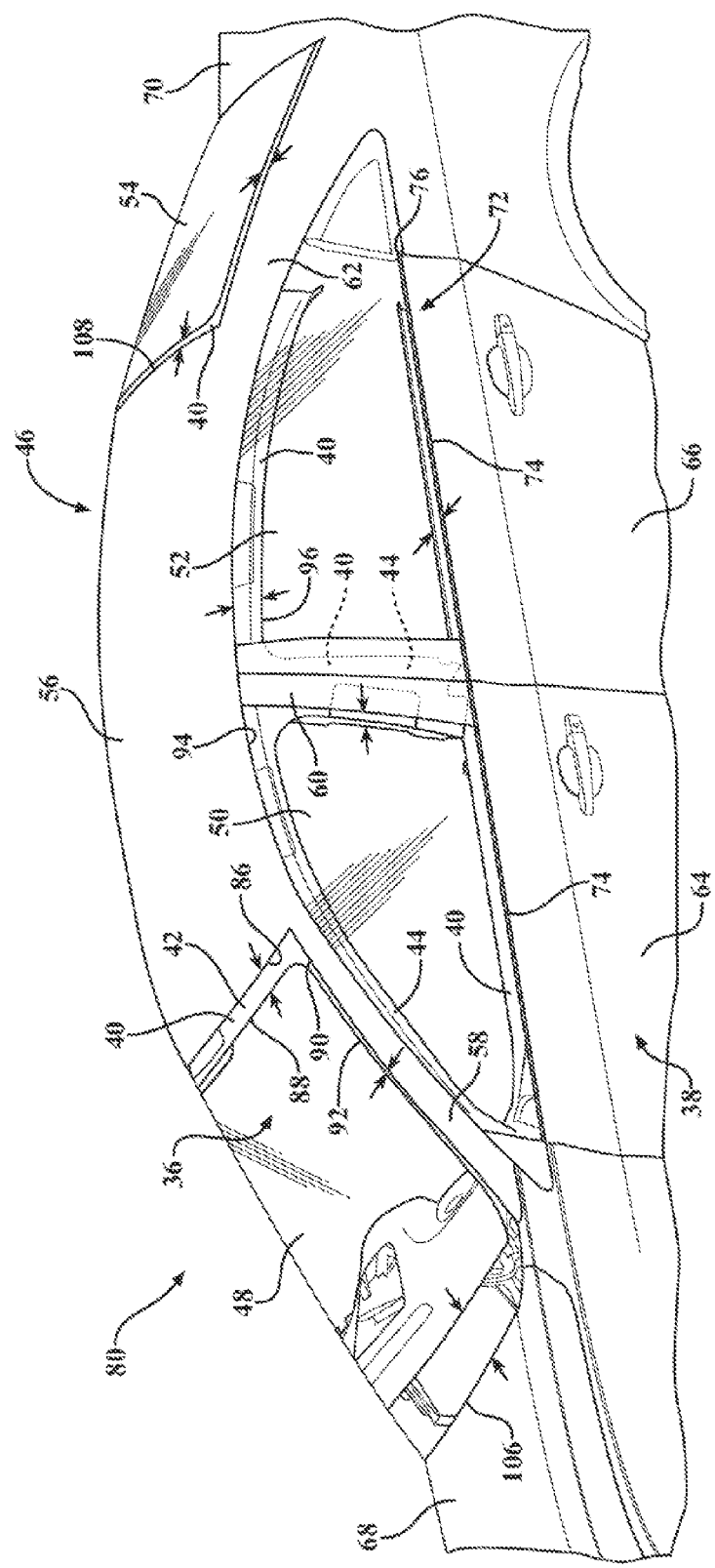
FIG. 4 is a schematic perspective view of a generic vehicle.

Referring to FIGS. 3 and 4, generally, vehicles include the vehicle compartment 14. It is to be appreciated that the vehicle can be a car, as illustrated in FIGS. 3 and 4; a truck; a sport utility vehicle (SUV); a van; a commercial vehicle, such as a semi; or any other suitable vehicle. In addition, generally, vehicles include an interior 36 inside the vehicle compartment 14 and an exterior 38 outside of the vehicle compartment 14. In other words, whether the vehicle is the car, the truck, the SUV, etc., that vehicle includes the interior 36 and the exterior 38.

The interior 36 of the vehicle includes at least one interior component 40 inside the vehicle compartment 14. The interior component 40 of the vehicle can include at least one or more headliners 42 and one or more trim pieces 44. It is to be appreciated that the trim pieces 44 can also be referred to as garnish and the interior 36 of the vehicle can include interior components 40 other than the headliner 42 and the trim pieces 44.

Furthermore, generally, the exterior 38 of the vehicle includes at least one exterior component 46 outside of the vehicle compartment 14. The exterior component 46 of the vehicle can include at least one of a windshield 48, a first side window 50, a second side window 52, a rear window 54, and a roof 56. Optionally, the exterior component 46 of the vehicle can include at least one of a first pillar 58, a second pillar 60, a third pillar 62, a first door 64, a second door 66, a hood 68, and a trunk 70. It is to be appreciated that the first pillar 58 can be referred to as an A-pillar, the second pillar 60 as a B-pillar, and the third pillar 62 as a C-pillar as known to those skilled in the art. Optionally, the exterior 38 of the vehicle can include exterior components 46 other than the windshield 48, the first side window 50, the second side window 52, the rear window 54, the roof 56, the first, second, and third pillars 58, 60, 62, the first and second doors 64, 66, the hood 68, and the trunk 70.

It is to also be appreciated that an upper portion 72 of the vehicle compartment 14 can be referred to as a greenhouse or upper compartment as known to those skilled in the art. Generally, the upper portion 72 or greenhouse includes one or more side windows 50, 52 adjacent to a window edge 74 of one or more doors 64, 66 and extends upwardly to the roof 56 of the vehicle. In other words, the upper portion 72 or greenhouse includes an area above a belt-line 76 of the vehicle to the roof 56 as known to those skilled in the art.

As briefly mentioned above, one or more interior surfaces 12, 134, 142 of one or more vehicle compartments 14, 144 can be generated for one or more vehicles. For example, a plurality of different interior surfaces 12, 134, 142 can be generated for one vehicle. Likewise, one interior surface 12, 134, 142 can be generated for a plurality of different vehicles. Furthermore, a plurality of different interior surfaces 12, 134, 142 can be generated for a plurality of different vehicles. Therefore, for illustrative purposes, the below discussion will begin with generating one interior surface 12 of one vehicle compartment 14 for one vehicle. Generally, the interior surface 12, 134, 142 generated with the below methods 1000, 2000 are the upper portion 72 or greenhouse of the vehicle compartment 14, 144. Optionally, interior surfaces 12, 134, 142 other than the upper portion 72 or greenhouse can be generated with the below methods 1000, 2000.

Figure 5:
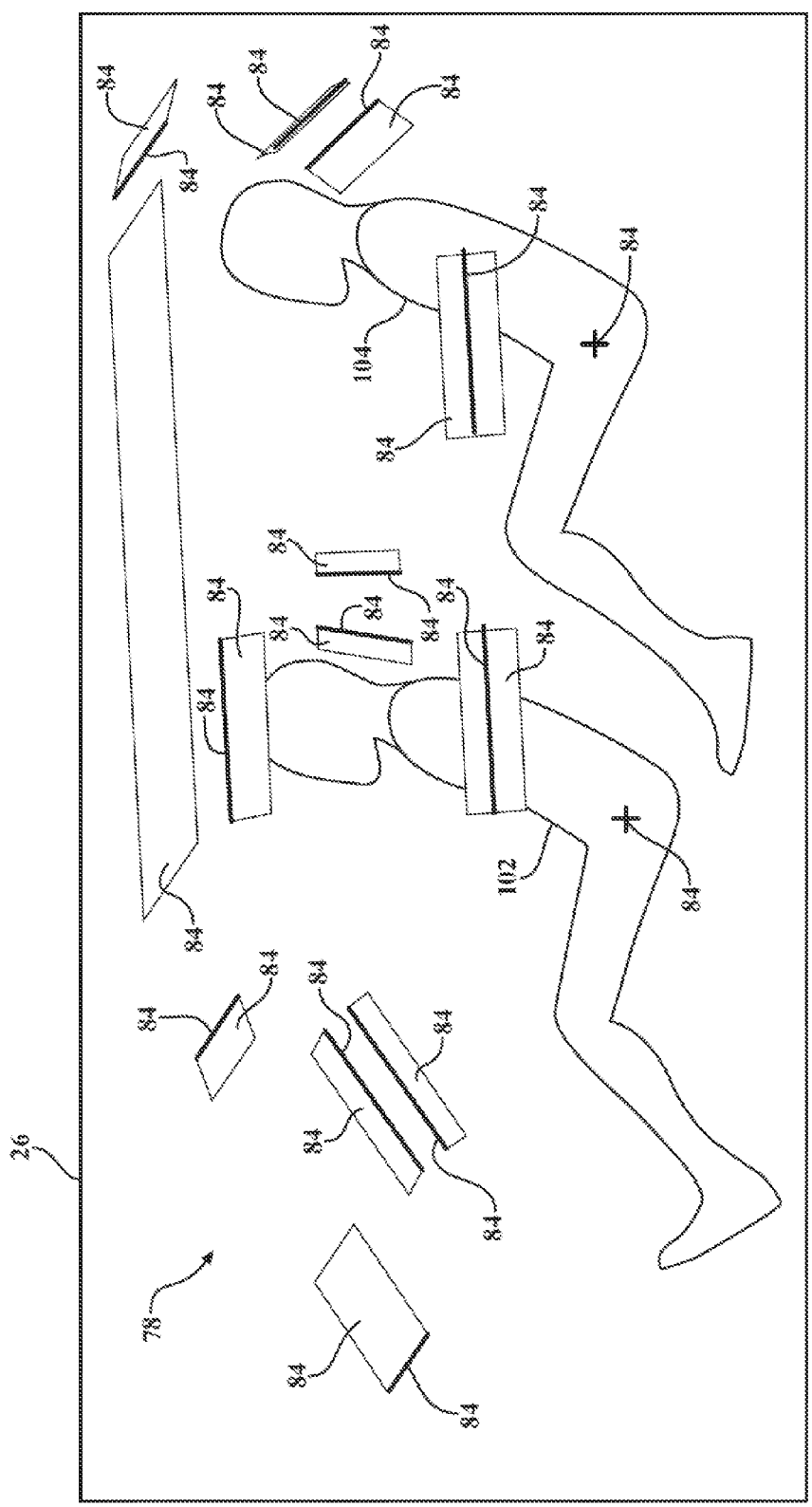
FIG. 5 is a schematic perspective view of a general template being displayed on a display device.

Preliminarily, referring to FIGS. 4 and 5, a general template 78 is created for a generic vehicle 80. For example, if it is desirable to generate an interior surface 12 of a car, the general template 78 contains general data or information regarding the vehicle compartment 14 of cars. As another example, if it is desirable to generate an interior surface of a truck, the general template 78 contains general data or information regarding the vehicle compartment 14 of trucks.

Figure 8:
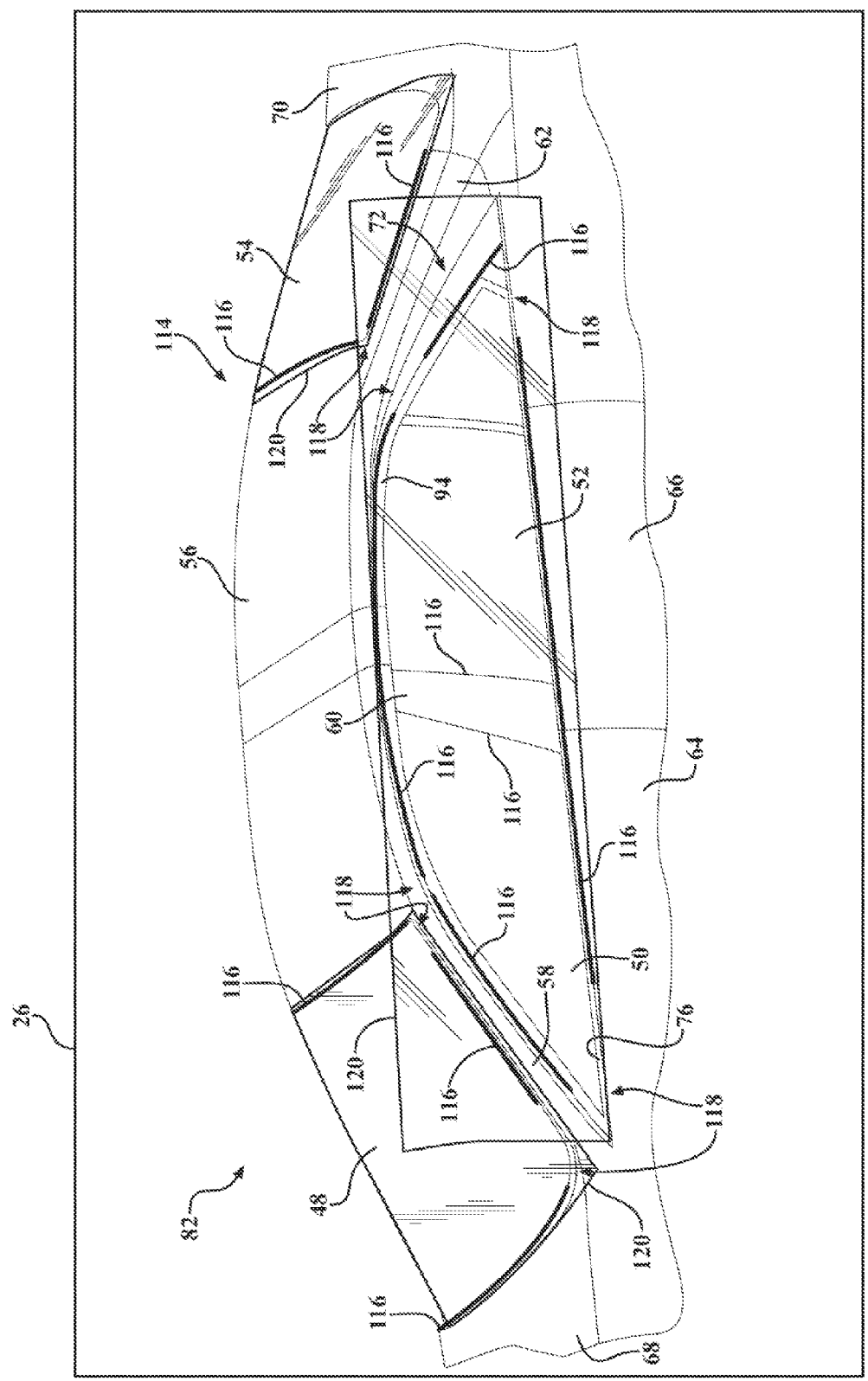
FIG. 8 is a schematic perspective view of a first exterior surface of the first specific vehicle being displayed on the display device shown in FIG. 1.

The general template 78 is accessible by the users 16 and utilized by the user 16 to generate the interior surface 12 of the vehicle compartment 14 for a specific vehicle 82 (see FIG. 8). The specific vehicle 82 can be a specific type or model of vehicle. As mentioned above, one specific vehicle 82 is illustrated in FIG. 8. Therefore, data or information regarding the vehicle compartment 14 of the generic vehicle 80 is utilized to generate data or information regarding the vehicle compartment 14 of the specific vehicle 82.

Turning to FIGS. 4, 5 and 26, the method 1000 includes providing, at block 1002, a plurality of identifiers 84 representing components 46 of the generic vehicle 80 and providing, at block 1004, general criteria for each of the identifiers 84 of the generic vehicle 80. The method 1000 also includes associating, at block 1006, each of the general criteria with the respective identifier 84 to define the general template 78. The components 46 are referred to as exterior components 46 for the below discussion. The exterior components 46 for any vehicle have been discussed above and can include at least one of the windshield 48, the first side window 50, the second side window 52, the rear window 54, the roof 56, the hood 68, the trunk 70, etc. Therefore, the identifiers 84 can be represented as the windshield 48, the first side window 50, the roof 56, etc. or can be represented as a portion of the windshield 48, a portion of the first side window 50, a portion of the roof 56, etc.

Figures 6, 7:
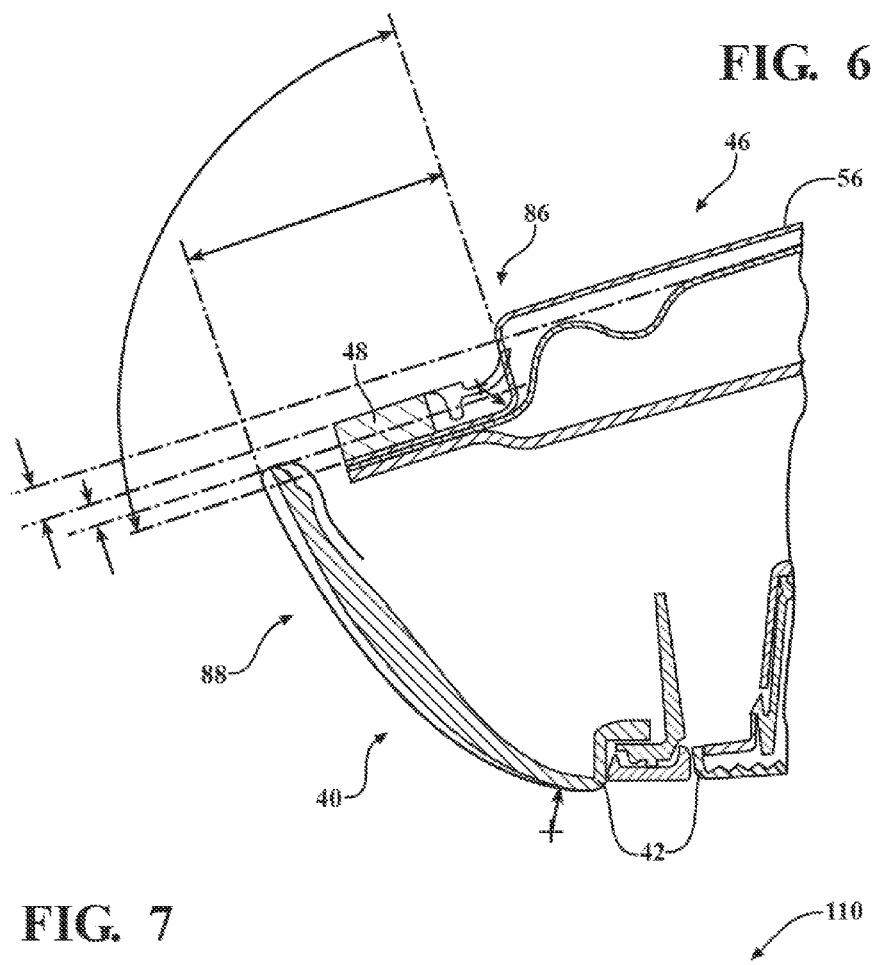
FIG. 6 is a schematic cross-sectional view of a roof and a headliner of the generic vehicle shown in FIG. 4.
FIG. 7 is a schematic view of a menu.

The general criteria provides data or information regarding various features or components 40, 46 of the generic vehicle 80. In certain embodiments, as shown in FIGS. 4 and 6, the general criteria can provide data regarding general relationships between the interior components 40 and the exterior components 46 of the generic vehicle 80, such as, constant relationships, etc. As a reminder, the interior and exterior components 40, 46 have been generally discussed above for any vehicle and thus these components 40, 46 can be for the generic vehicle 80. For example, referring to FIG. 4, the general criteria can include the general relationship between a front edge 86 of the roof 56 and a front edge 88 of the headliner 42 of the generic vehicle 80. As another example, the general criteria can include the general relationship between a side edge 90 of the first pillar 58 and a first edge 92 of one of the trim pieces 44 of the generic vehicle 80. As yet another example, the general criteria can include the general relationship between a D-line edge 94 of the roof 56 and a side edge 96 of the headliner 42 of the generic vehicle 80. For illustrative purposes only, FIG. 4 identifies eight sets of arrows between interior and exterior components 40, 46 to illustrate various general relationship locations. It is to be appreciated that other general relationship locations are contemplated.

Therefore, providing, at block 1004, the general criteria can include determining the general relationship between the interior and exterior components 40, 46 of the generic vehicle 80. For example, as shown in FIG. 6, the front edge 86 of the roof 56 and the front edge 88 of the headliner 42 can be determined. Specifically, data regarding ratios, offsets, curves, angles, radiuses, etc. between the roof 56 and the headliner 42 can be determined for the general criteria and this data is associated with the respective identifier 84 for the general template 78. Various angles, radiuses, offsets, etc. are identified in FIG. 6 for illustrative purposes only. It is to be appreciated that data regarding ratios, offsets, curves, angles, etc. can be determined for each desired component 40, 46 of the generic vehicle 80. Also, determining the general relationship can include calculating the general relationship between the interior and exterior components 40, 46 of the generic vehicle 80.

Furthermore, in certain embodiments, providing, at block 1004, the general criteria can include providing guideline data to orientate various features of the generic vehicle 80 relative to each other. In one embodiment, the guideline data can orientate one or more features of the interior component 40 relative to the edges of that particular interior component 40. See above for a general discussion of the interior components 40. For example, if vehicle guidelines desire that the headliner 42 has a particular configuration or contour 98 (see FIG. 17) at a particular location, the guideline data can store that relationship. As mentioned above, FIG. 17 illustrates one example of a particular contour 98 at a particular location in the interior surface 12 of the headliner 42 as desired for that specific vehicle 82. The guideline data can include any vehicle guidelines, such as, for example, national vehicle standards or 201U requirements as known to those skilled in the art, etc.

In addition, in certain embodiments, providing, at block 1004, the general criteria can include providing general occupant location data 100 (see FIG. 7). The general occupant location data 100 provides general relationships of a first occupant 102 and a second occupant 104 (see FIG. 5) relative to the interior and/or exterior components 40, 46 of the generic vehicle 80. In other words, the general occupant location data 100 provides general relationships of the first and second occupants 102, 104 relative to each other, relative to the windshield 48, relative to the first and second side windows 50, 52, relative to the first pillar 58, etc. In addition, any suitable number of occupants can be utilized for the general occupant location data 100.

Generally, referring to FIG. 5, the identifiers 84 are orientated in the general location of the respective exterior components 46. Therefore, providing, at block 1002, the identifiers 84 can include orientating the identifiers 84 in the general location of the respective exterior components 46. For example, when comparing FIGS. 4 and 5, if one of the identifiers 84 represent a bottom edge 106 of the windshield 48, that identifier 84 will be orientated in the general location of that particular bottom edge 106 of the windshield 48. As another example when comparing FIGS. 4 and 5, if another one of the identifiers 84 represents a top edge 108 of the rear window 54, that identifier 84 will be orientated in the general location of that particular top edge 108 of the rear window 54. In addition, the identifiers 84 can be in any suitable orientation and location.

In addition to the above, the identifiers 84 can represent the first occupant 102 and the second occupant 104 as shown in FIG. 5. The first and second occupants 102, 104 can be spaced from each other and orientated in the general location of passengers in the generic vehicle 80. In other words, one of the identifiers 84 can be generally orientated to represent the first occupant 102 in a driver's location and another one of the identifiers 84 can be generally orientated to represent the second occupant 104 in a passenger location, etc. Therefore, providing, at block 1002, the identifiers 84 can include orientating the first and second occupants 102, 104 relative to the vehicle compartment 14 of the generic vehicle 80. In addition, any suitable number of occupants can be utilized for the identifiers 84.

In summary, the general criteria can provide various data or information, such as, for example general relationship data, guideline data, and/or general occupant location data 100. Furthermore, the general criteria can provide any other suitable data or information. As discussed above, the method 1000 includes associating, at block 1006, each of the general criteria with the respective identifier 84 to define the general template 78. As such, associating, at block 1006, each of the general criteria can include associating each of the general criteria, including general relationship data, guideline data, and/or general occupant location data 100 with the respective identifier 84 to further define the general template 78.

Furthermore, turning to FIG. 26, the method 1000 includes storing, at block 1008, the general template 78 in the memory 20 of the host machine 18. In other words, after the general template 78 is created, this template 78 can be stored in the memory 20 such that the users 16 can access the general template 78 as desired. Generally, the user 16 can access the general template 78 by utilizing a menu 110 as shown in FIG. 7. Also, the menu 110 can be displayed on the display device 26 and can be further defined as a drop-down menu or any other suitable menu to access the general template 78.

The method 1000 further includes displaying, at block 1010, the general template 78, including the identifiers 84, on the display device 26 (see FIGS. 5 and 26). Generally, after the general template 78 is created, the general template 78, including the identifiers 84, can be displayed on the display device 26. In other words, when the general template 78 is accessed, the general template 78, including the identifiers 84, is displayed on the display device 26 as shown in FIG. 5. More specifically, in certain embodiments, the method 1000 can include receiving, at block 1012, a selection from the user 16 for the general template 78 to display the general template 78 on the display device 26 and the method can include receiving, at block 1014, a selection from the user 16 for the general occupant location data 100 to display the first and second occupants 102, 104 on the display device 26. FIG. 5 illustrates the general template 78 and the first and second occupants 102, 104. Generally, displaying, at block 1010, the general template 78 occurs after receiving, at block 1012, a selection from the user 16 for the general template 78. As suggested above, the user 16 can select the general template 78 by utilizing the menu 110 as shown in FIG. 7. Furthermore, the user 16 can select the general occupant location data 100 by utilizing the menu 110 as shown in FIG. 7.

Additionally, the method 1000 includes storing, at block 1016, exterior surface data 112 of a configuration of the specific vehicle 82 in the memory 20 of the host machine 18. In other words, to generate the interior surface 12 of the vehicle compartment 14, the exterior surface data 112 of the configuration of the specific vehicle 82 is stored in the memory 20. Generally, the exterior surface data 112 is pre-determined and stored in the memory 20 to be accessed when desired to generate the interior surface 12 related to that exterior surface data 112.

The method 1000 further includes receiving, at block 1018, a selection from the user 16 for the exterior surface data 112 of the configuration of the specific vehicle 82 from the memory 20 of the host machine 18. Therefore, after the exterior surface data 112 is stored, the user 16 can select and access the exterior surface data 112. Generally, the exterior surface data 112 can be selected by utilizing the menu 110 as discussed above and shown in FIG. 7.

In addition, the method 1000 includes displaying, at block 1020, an exterior surface 114 representing the selected exterior surface data 112 of the configuration of the specific vehicle 82 (see FIG. 8). In one embodiment, the exterior surface 114 is displayed as a three-dimensional configuration on the display device 26. When both the general template 78 and the exterior surface data 112 is selected, both can be displayed on the display device 26 as shown in FIGS. 9-14. Generally, receiving, at block 1018, a selection from the user 16 for the exterior surface data 112 occurs before displaying, at block 1020, the exterior surface 114.

Referring to FIG. 8, optionally, one or more lines or curves 116 are displayed along the exterior surface 114 to represent exterior surface data 112 for the particular location. Therefore, displaying, at block 1020, the exterior surface 114 representing the selected exterior surface data 112 can include displaying at least one line or curve 116 along the exterior surface 114 of the selected exterior surface data 112. For example, for illustrative purposes in FIG. 8, nine heavy-weighted lines/curves 116 are illustrated along the exterior surface 114 of the specific vehicle 82 for easily identifying the exterior surface 114 to be selected as discussed further below. FIG. 8 illustrates one of these lines 116 along the belt-line 76 with that line 116 associated with the exterior surface data 112 for the structure of the vehicle along the belt-line 76. FIG. 8 illustrates another one of these curves 116 along the D-line edge 94 of the roof 56 with that curve 116 associated with the exterior surface data 112 for the structure of the vehicle along the D-line edge 94. So on and so forth for the remaining lines/curves 116 of FIG. 8. It is to be appreciated that not all of the lines or curves 116 that can be selected in FIG. 8 have increased line-weight, such as, for example, the lines 116 along the second pillar 60 or B-pillar. Therefore, the lines or curves 116 can be incorporated into the exterior surface 114 representing the selected exterior surface data 112 such that all of the lines/curves 116 displayed for the exterior surface 114 are the same weight.

Figure 16:
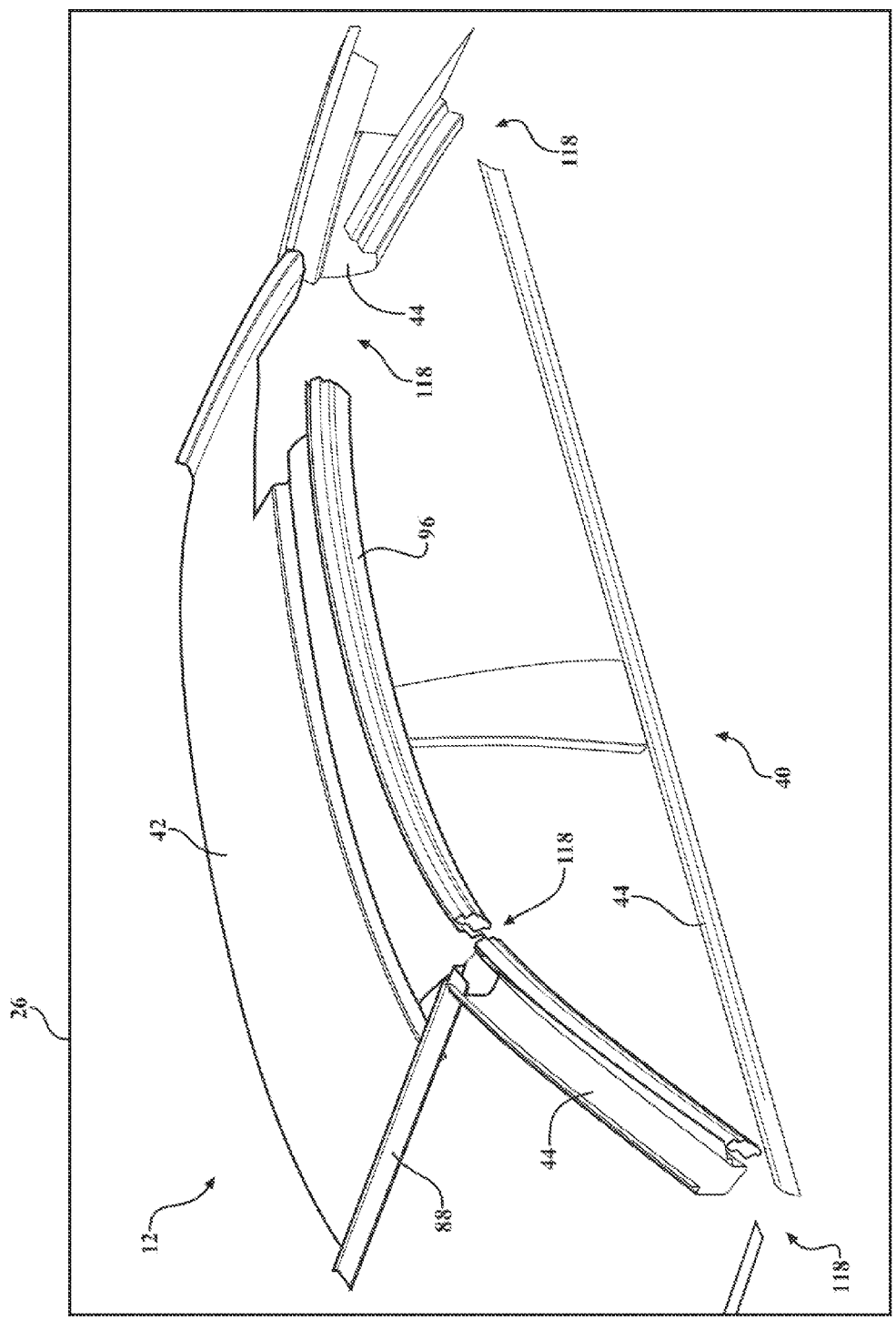
FIG. 16 is a schematic top perspective view of a first interior surface of the first specific vehicle being displayed on the display device.

It is to further be appreciated that if multiple lines/curves 116 are provided along the belt-line 76 or any other exterior surface 114 of the specific vehicle 82, these lines/curves 116 can be joined together. It is to also be appreciated that the lines or curves 116 can be trimmed or spaced from each other to represent a transition area 118 (see FIG. 8) between the lines/curves 116 and thus separate the interior components 40 of the specific vehicle 82 such that the interior surface 12 is not generated for these transition areas 118 as shown in FIG. 16. In addition, more or less lines/curves 116 can be utilized as desired.

As another option, as shown in FIG. 8, a glass projection area 120 can be displayed on the display device 26. Therefore, displaying, at block 1020, the exterior surface 114 representing the selected exterior surface data 112 can include displaying the glass projection area 120 generally over the windshield 48, the first and second side windows 50, 52 and/or the rear window 54. Furthermore, the method 1000 can include enlarging, at block 1022, the glass projection area 120 to encompass the windshield 48, the first and second side windows 50, 52 and the rear window 54. The glass projection area 120 encompasses the windshield 48, the first and second side windows 50, 52 and the rear window 54 such that the lines or curves 116 as discussed immediately above overlap the glass projection area 120. Overlapping these features allow the lines/curves 116 to be projected onto the respective windshield 48, the respective side windows 50, 52 and the respective rear window 54 to allow calculations of the general criteria with the selected exterior surface data 112. In addition, the glass projection area 120 can automatically be configured to an appropriate size encompassing the windshield 48, the first and second side windows 50, 52 and the rear window 54. The glass projection area 120 can be enlarged by utilizing a menu or any other suitable icon etc. It is to be appreciated that the glass projection area 120 has been eliminated in FIGS. 9-15 for illustrative purposes only.

Figure 9:
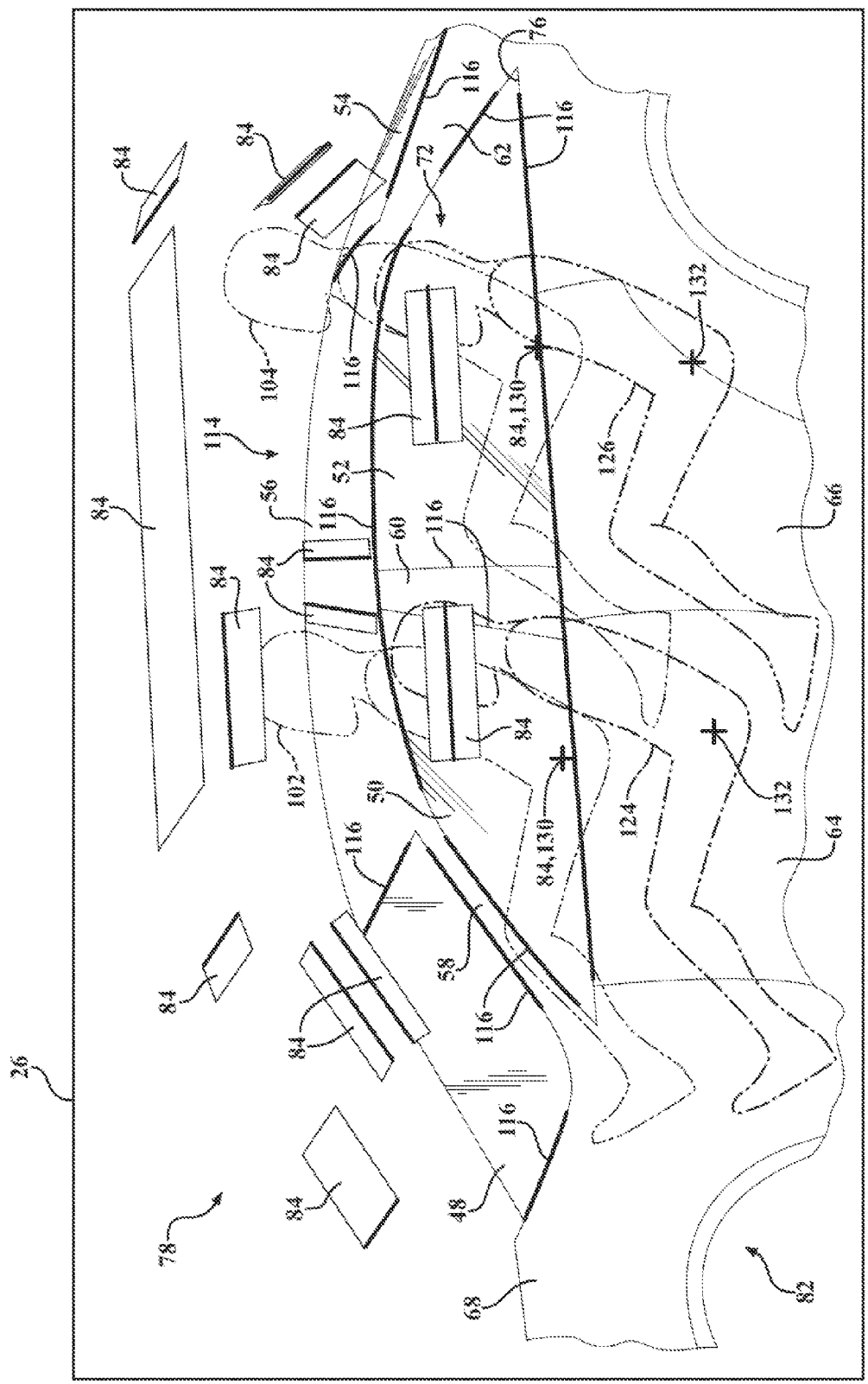
FIG. 9 is a schematic perspective view of the general template and the first exterior surface of the first specific vehicle being displayed on the display device.

Furthermore, specific occupant location data 122 (see FIG. 7) of the configuration of the specific vehicle 82 can be stored in the memory 20 of the host machine 18. Therefore, referring to FIG. 26, the method 1000 can further include storing, at block 1024, the specific occupant location data 122 in the memory 20. Referring to FIG. 9, the specific occupant location data 122 corresponds to a first specific occupant 124 and a second specific occupant 126 in the vehicle compartment 14 in relation to the interior and/or exterior components 40, 46. The interior and exterior components 40, 46 have been generally discussed above for any vehicle and thus these components 40, 46 can be for the specific vehicle 82. Storing, at block 1024, the specific occupant location data 122 can occur before displaying, at block 1010, the general template 78. Furthermore, storing, at block 1024, the specific occupant location data 122 can occur before or after storing, at block 1016, the exterior surface data 112 of the configuration of the specific vehicle 82.

In certain embodiments, the method 1000 can include receiving, at block 1026, a selection from the user 16 for the specific occupant location data 122 of the configuration of the specific vehicle 82 from the memory 20 of the host machine 18. Generally, the user 16 can access the specific occupant location data 122 by utilizing the menu 110 as shown in FIG. 7. Also, the menu 110 can be displayed on the display device 26 and can be further defined as a drop-down menu or any other suitable menu to access the specific occupant location data 122.

The method 1000 can also include displaying, at block 1028, the first and second specific occupants 124, 126, representing the specific occupant location data 122, after selecting the specific occupant location data 122. As such, the general template 78, including the identifiers 84, the exterior surface 114 representing the selected exterior surface data 112, and the first and second specific occupants 124, 126 representing the selected specific occupant location data 122 can be displayed on the display device 26 as shown in FIGS. 9-14. In other words, the exterior surface 114 of the specific vehicle 82 is displayed, the first and second specific occupants 124, 126 are displayed within the vehicle compartment 14, and the general template 78 is generally displayed outside of the vehicle compartment 14 (see FIGS. 9-14).

Turning to FIG. 26, generally, the method 1000 includes receiving, at block 1030, a selection from the user 16 for one of the identifiers 84 of the general template 78 and receiving, at block 1032, a selection from the user 16 for a desired location of the exterior surface 114 of the specific vehicle 82 to associate the general criteria for the selected one of the identifiers 84 with the exterior surface data 112 of the selected desired location. Generally, receiving, at block 1030, a selection from the user 16 for one of the identifiers 84 of the general template 78 and receiving, at block 1032, a selection from the user 16 for a desired location of the exterior surface 114 of the specific vehicle 82 occurs after displaying, at block 1010, the general template 78, including the identifiers 84, on the display device 26 and displaying, at block 1020, an exterior surface 114 representing the selected exterior surface data 112 of the configuration of the specific vehicle 82. It is to be appreciated that receiving, at block 1030, a selection from the user 16 for one of the identifiers 84 of the general template 78 and receiving, at block 1032, a selection from the user 16 for a desired location occurs after joining/trimming the lines/curves 116 and enlarging, at block 1022, the glass projection area 120.

Figure 10:
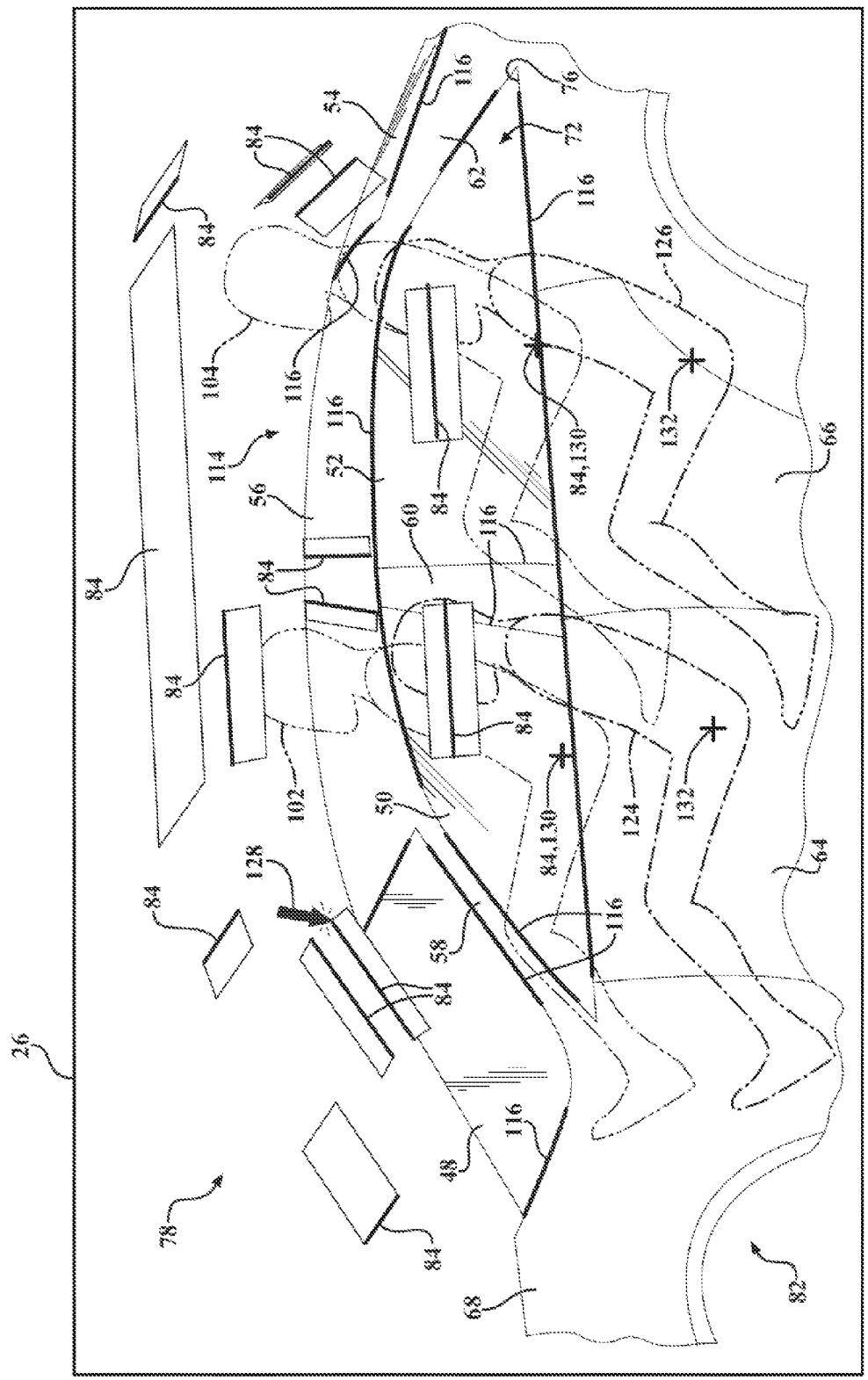
FIG. 10 is a schematic perspective view of the general template and the first exterior surface of the first specific vehicle being displayed, with a pointer icon touching a line, representing one identifier of the general template.
Figure 11:
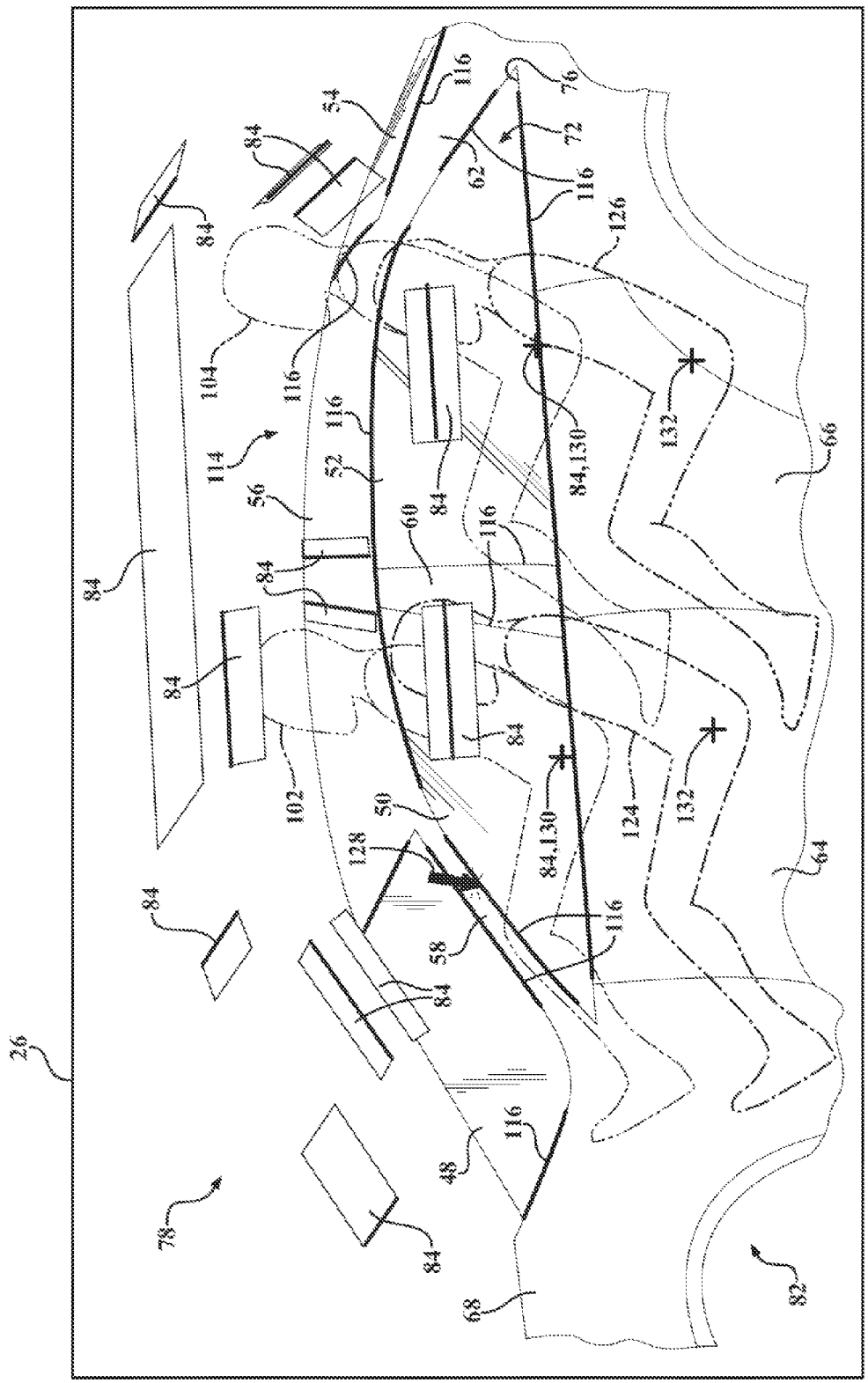
FIG. 11 is a schematic perspective view of the general template and the first exterior surface of the first specific vehicle being displayed, with the pointer icon touching a line of the first exterior surface of the first specific vehicle, with the line touched by the pointer icon in FIG. 10 removed.
Figure 12:
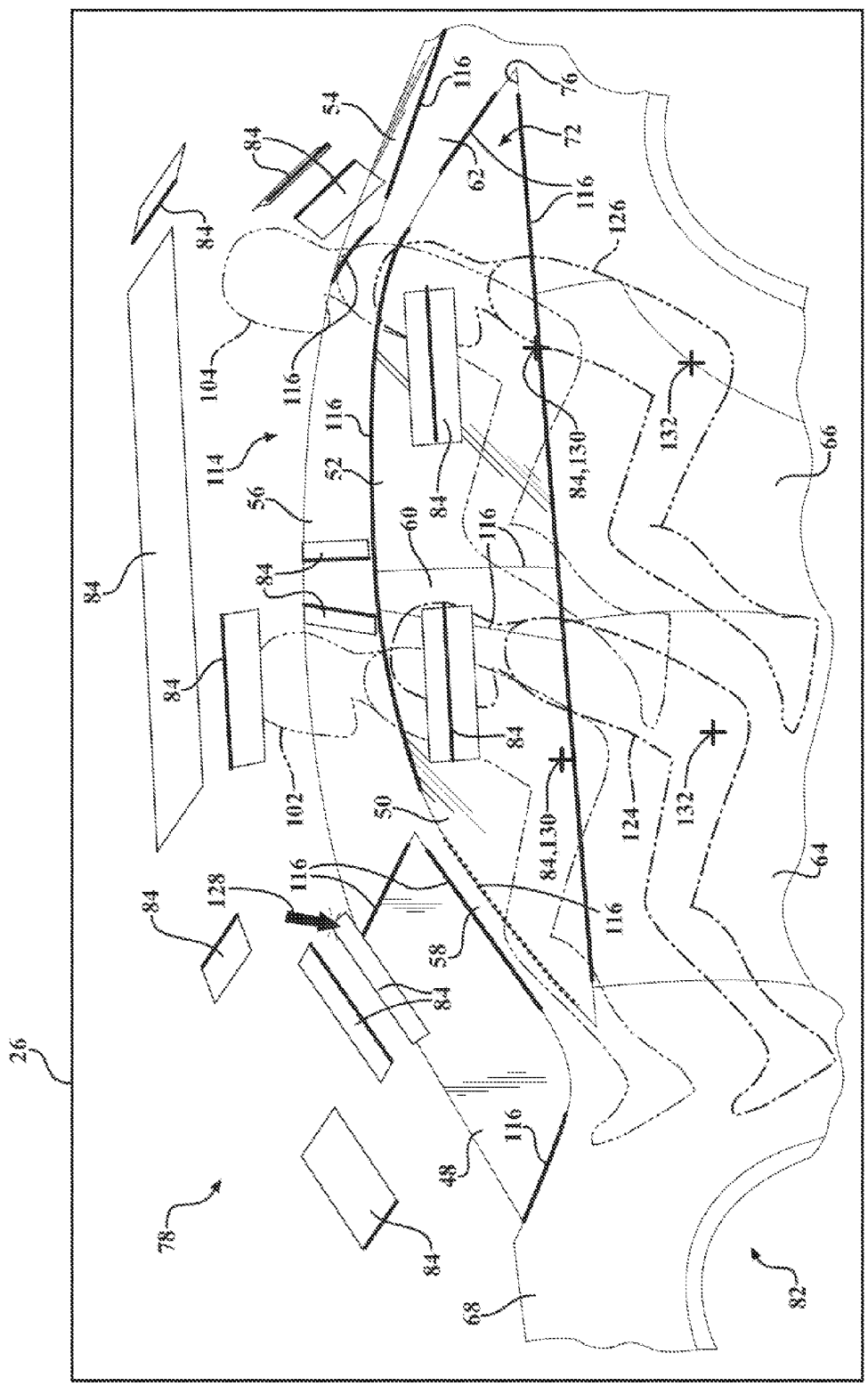
FIG. 12 is a schematic perspective view of the general template and the first exterior surface of the first specific vehicle being displayed, with the pointer icon touching a surface box, representing another identifier of the general template, with the line touched by the pointer icon in FIG. 11 dashed.

In certain embodiments, receiving, at block 1030, a selection from the user 16 for one of the identifiers 84 and receiving, at block 1032, a selection from the user 16 for the desired location can include receiving a first selection from the user 16 for a first identifier 84 of the general template 78 and receiving a first selection from the user 16 for a first desired location of the exterior surface 114 of the specific vehicle 82 to associate the general criteria for the selected first identifier 84 with the exterior surface data 112 of the selected first desired location. Therefore, the first selection is received to associate the general criteria for the selected first identifier 84 with the exterior surface data 112 of the selected first desired location. For example, FIG. 10 illustrates a pointer icon 128 selecting one of the identifiers 84 of the general template 78, such as, for example, the first identifier 84. FIG. 11 illustrates the pointer icon 128 then selecting the desired location of the exterior surface 114 of the specific vehicle 82, such as the first desired location. Once the first identifier 84 is selected and then the desired location is selected, that first identifier 84 disappears from the display device 26 as shown in FIG. 11. Furthermore, once the first desired location is selected, the general criteria for the selected first identifier 84 is associated with that selected first desired location; and for illustrative purposes only, FIG. 12 shows the selected heavy-line 116 being dashed to indicate this association. It is to be appreciated that, in certain embodiments, when selecting the desired location, no visible line change will occur. As suggested above with the example of FIGS. 10-12, the identifiers 84 to be selected correspond to similar features of the exterior surface 114. In other words, if the identifier 84 selected is for the first pillar 58 adjacent to the windshield 48, the corresponding desired location to be selected is the first pillar 58 adjacent to the windshield 48. This pattern is repeated for the remaining identifiers 84 and desired locations.

Figure 13:
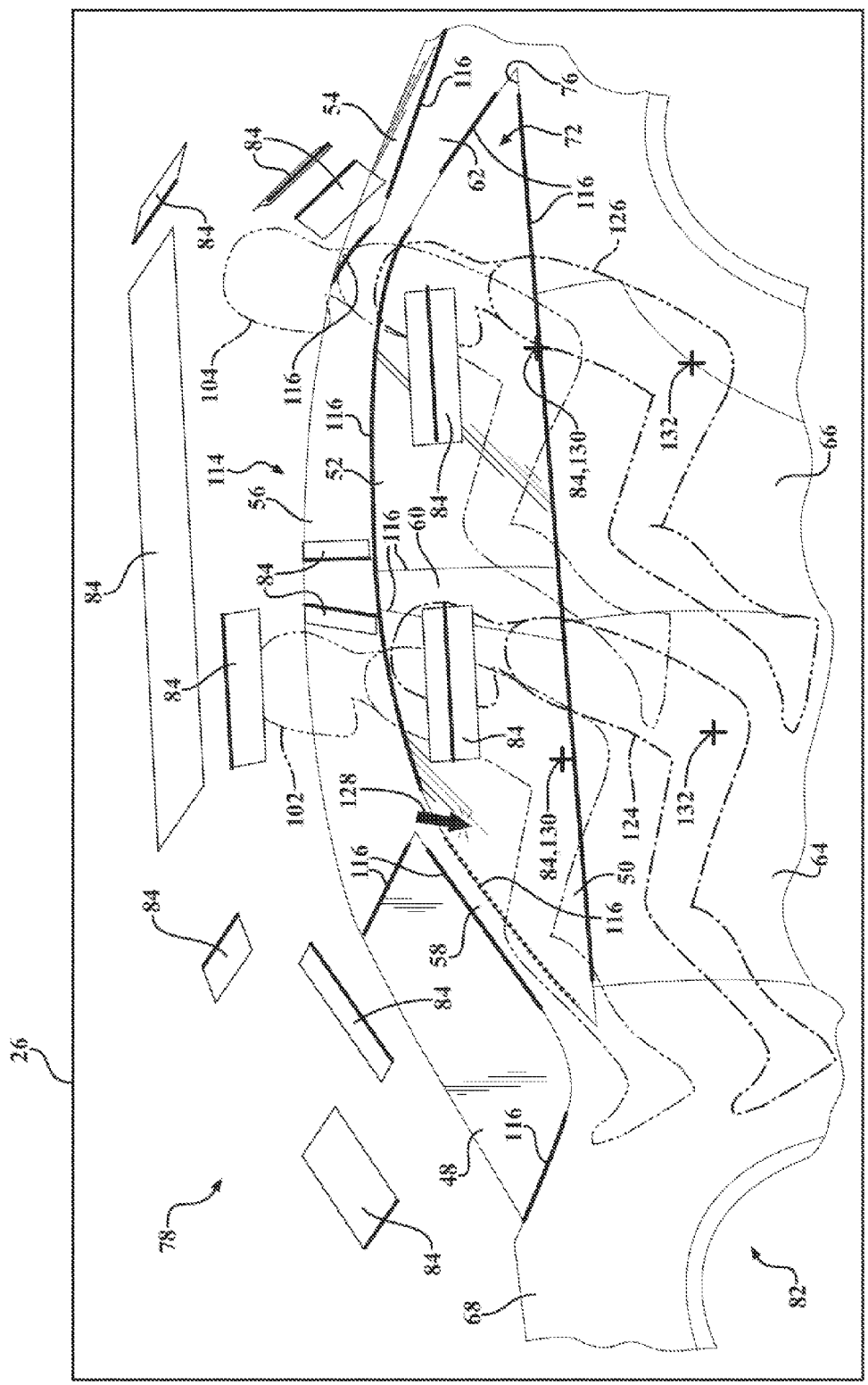
FIG. 13 is a schematic perspective view of the general template and the first exterior surface of the first specific vehicle being displayed, with the pointer icon touching a first side window of the first exterior surface of the first specific vehicle, with the surface box touched by the pointer icon in FIG. 12 removed.
Figure 14:
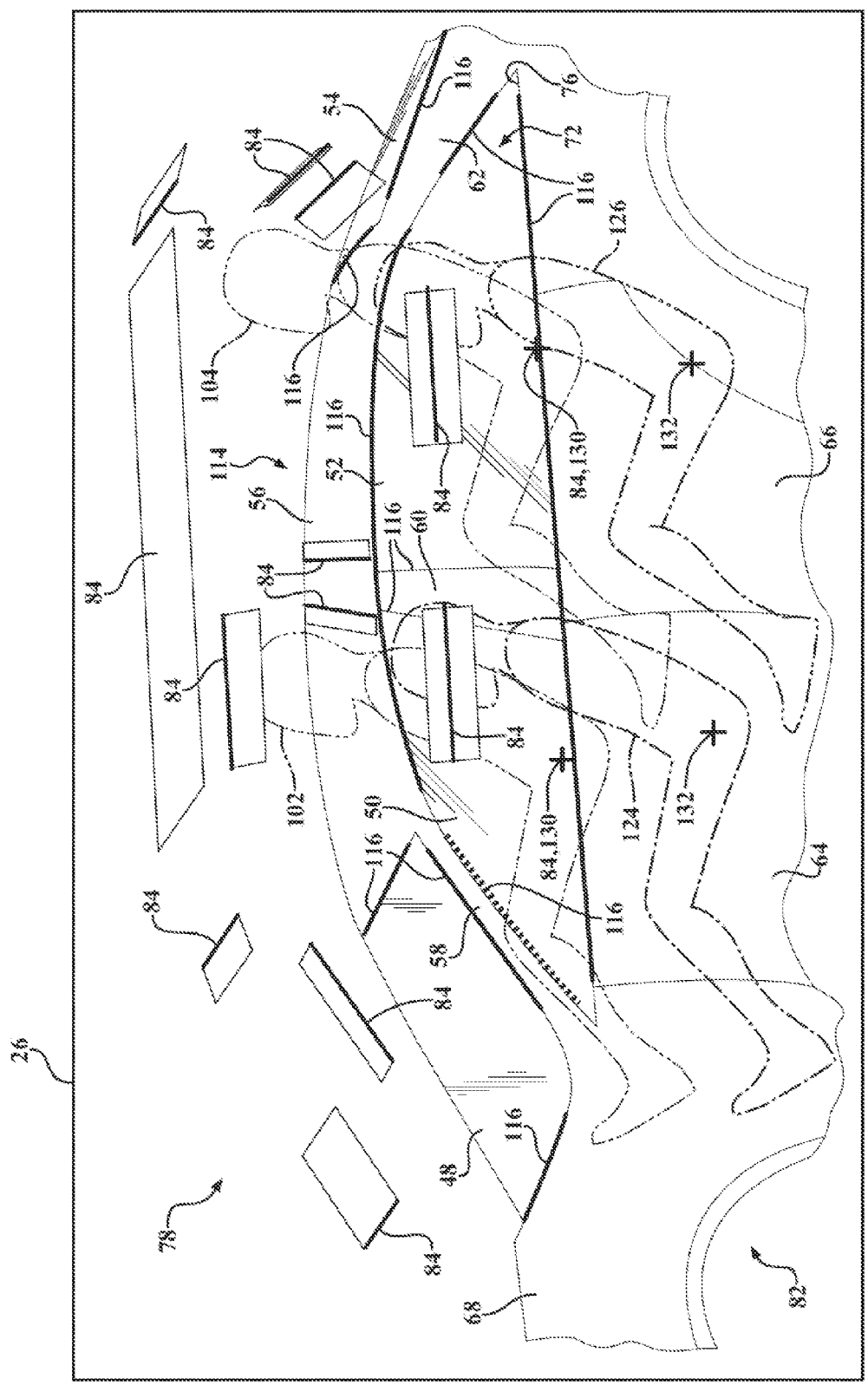
FIG. 14 is a schematic perspective view of the general template and the first exterior surface of the first specific vehicle being displayed, with the line touched in FIG. 11 dashed into the first side window.

In addition, in certain embodiments, receiving, at block 1030, a selection from the user 16 for one of the identifiers 84 and receiving, at block 1032, a selection from the user 16 for the desired location can include receiving a second selection from the user 16 for a second identifier 84 of the general template 78 and receiving a second selection from the user 16 for a second desired location of the exterior surface 114 of the specific vehicle 82 to associate the general criteria for the selected second identifier 84 with the exterior surface data 112 of the selected second desired location. Therefore, the second selection is received to associate the general criteria for the selected second identifier 84 with the exterior surface data 112 of the selected second desired location. For example, FIG. 12 illustrates the pointer icon 128 selecting another one of the identifiers 84, and specifically selecting, for example, the second identifier 84 of the general template 78. FIG. 13 illustrates the pointer icon 128 then selecting another desired location of the exterior surface 114 of the specific vehicle 82, and specifically selecting the second desired location of the exterior surface 114. Once the second identifier 84 is selected and then the second desired location is selected, that second identifier 84 disappears from the display device 26 as shown in FIG. 13. Furthermore, once the second desired location is selected, the general criteria for the selected second identifier 84 is associated with that selected second desired location; and for illustrative purposes only, FIG. 14 shows the dashes changed to represent the association of both the first and second selected desired locations adjacent to the first side window 50. Again, as mentioned above, in certain embodiments, when selecting the second desired location, no visible line change will occur.

In addition, in certain embodiments, receiving, at block 1030, a selection from the user 16 for one of the identifiers 84 and receiving, at block 1032, a selection from the user 16 for the desired location can include receiving a third selection from the user 16 for a third identifier 84 of the general template 78 and receiving a third selection from the user 16 for a third desired location of the exterior surface 114 of the specific vehicle 82 to associate the general criteria for the selected third identifier 84 with the exterior surface data 112 of the selected third desired location. Therefore, the third selection is received to associate the general criteria for the selected third identifier 84 with the exterior surface data 112 of the selected second desired location. For example, even though not specifically illustrated, the pointer icon 128 can select another one of the identifiers 84, and specifically can select the third identifier 84 of the general template 78, such as, for example, a hip point 130 (see FIGS. 9-14) of the first occupant 102 of the general template 78. Then, the pointer icon 128 can select another one of the desired locations, and specifically can select the third desired location, such as a hip point 132 (see FIGS. 9-14) of the first specific occupant 124 of the exterior surface 114 of the specific vehicle 82.

Figure 15:
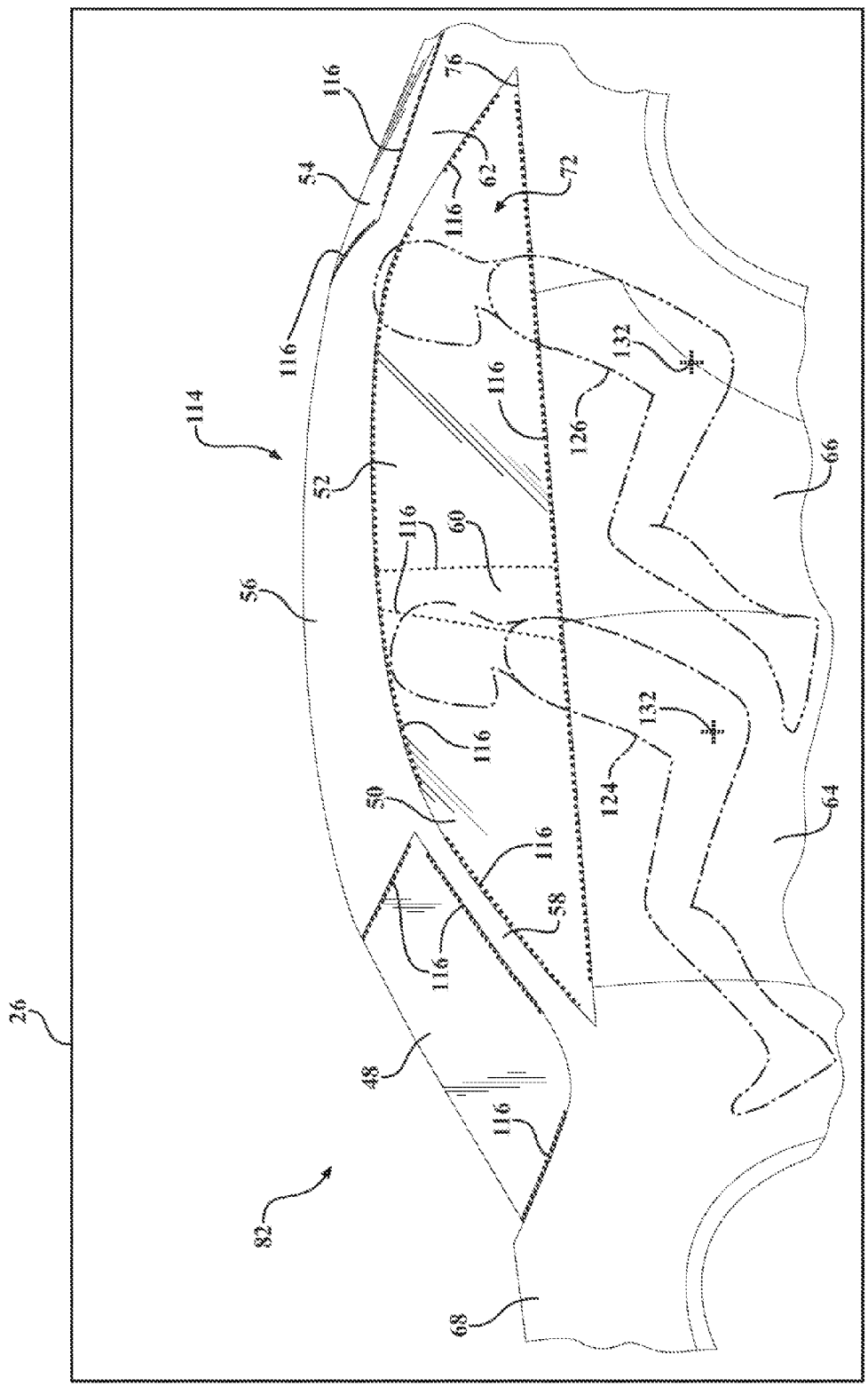
FIG. 15 is a schematic perspective view of the first exterior surface of the first specific vehicle with the general template removed and associated with the respective first exterior surface.

Even though only three examples of selecting identifiers 84 and desired locations are discussed immediately above, any suitable number of selections can be received from the user 16 for one of the identifiers 84 and one of the desired locations. This pattern of selecting identifiers 84 and desired locations are repeated until all of the identifiers 84 have been associated with respective desired locations; and thus all of the identifiers 84 of the general template 78 will be removed from the display device 26 once all of the associations have been made as shown in FIG. 15. For example, FIGS. 5, 9 and 10 illustrate identifiers 84 for the windshield 48 and edges adjacent to the windshield 48, the first and second side windows 50, 52 and edges adjacent to the first and second side windows 50, 52, the rear window 54 and edges adjacent to the rear window 54, the roof 56 and edges adjacent to the roof 56, the first, second and third pillars 58, 60, 62 and edges adjacent to the first, second and third pillars 58, 60, 62, and the first and second occupants 102, 104 of the general occupant location data 100. Furthermore, FIGS. 8-14 illustrate the exterior surface 114 of the specific vehicle 82, with certain desired locations identified in heavy-weighted lines 116. FIGS. 9-15 also illustrates the first and second specific occupants 124, 126 which cooperate with respective first and second occupants 102, 104 of the general occupant location data 100.

Referring to FIG. 26, generally, the method 1000 includes determining, at block 1034, interior surface data of the selected desired location, via the host machine 18, as a function of the general criteria of the selected one of the identifiers 84 and the exterior surface data 112 of the selected desired location. Generally, determining, at block 1034, interior surface data of the selected desired location occurs after receiving, at block 1030, a selection from the user 16 for one of the identifiers 84 and receiving, at block 1032, a selection from the user 16 for the desired location. In certain embodiments, determining, at block 1034, interior surface data of the selected desired location can include determining interior surface data of at least one of the first and second desired locations, via the host machine 18, as a function of the general criteria of at least one of the selected first and second identifiers 84 and the exterior surface data 112 of at least one of the first and second desired locations.

Furthermore, in certain embodiments, determining interior surface data of at least one of the first and second desired locations can include determining interior surface data of the first desired location, via the host machine 18, as a function of the general criteria of the selected first identifier 84 and the exterior surface data 112 of the first desired location. Therefore, the interior surface data of the first desired location is determined, via the host machine 18, as a function of the general criteria of the selected first identifier 84 and the exterior surface data 112 of the first desired location. In addition, in certain embodiments, determining interior surface data of at least one of the first and second desired locations can include determining interior surface data of the second desired location, via the host machine 18, as a function of the general criteria of the selected second identifier 84 and the exterior surface data 112 of the second desired location. Therefore, the interior surface data of the second desired location is determined, via the host machine 18, as a function of the general criteria of the selected second identifier 84 and the exterior surface data 112 of the second desired location.

More specifically, determining, at block 1034, the interior surface data of the selected desired location can include calculating the interior surface data from the general criteria of the selected one of the identifiers 84 and the exterior surface data 112 of the selected desired location. In certain embodiments, determining interior surface data of the first desired location includes calculating the interior surface data of the first desired location from the general criteria of the selected first identifier 84 and the exterior surface data 112 of the selected first desired location. Therefore, the interior surface data of the first desired location can be calculated from the general criteria of the selected first identifier 84 and the exterior surface data 112 of the selected first desired location. Furthermore, in certain embodiments, determining interior surface data of the second desired location includes calculating the interior surface data of the second desired location from the general criteria of the selected second identifier 84 and the exterior surface data 112 of the selected second desired location. Therefore, the interior surface data of the second desired location can be calculated from the general criteria of the selected second identifier 84 and the exterior surface data 112 of the selected second desired location.

Furthermore, in certain embodiments, the method 1000 can include associating, at block 1036, the interior surface data of the first desired location and the interior surface data of the second desired location with one another. In other words, the interior surface data of the first and second desired locations can cooperate with each other to generate the headliner 42 or the trim pieces 44, etc. Therefore, for example, the interior surface data of the first and second desired locations can cooperate to generate a front edge 88 of the headliner 42, a side edge 96 of the headliner 42, etc. as shown in FIGS. 16 and 17.

Figure 17:
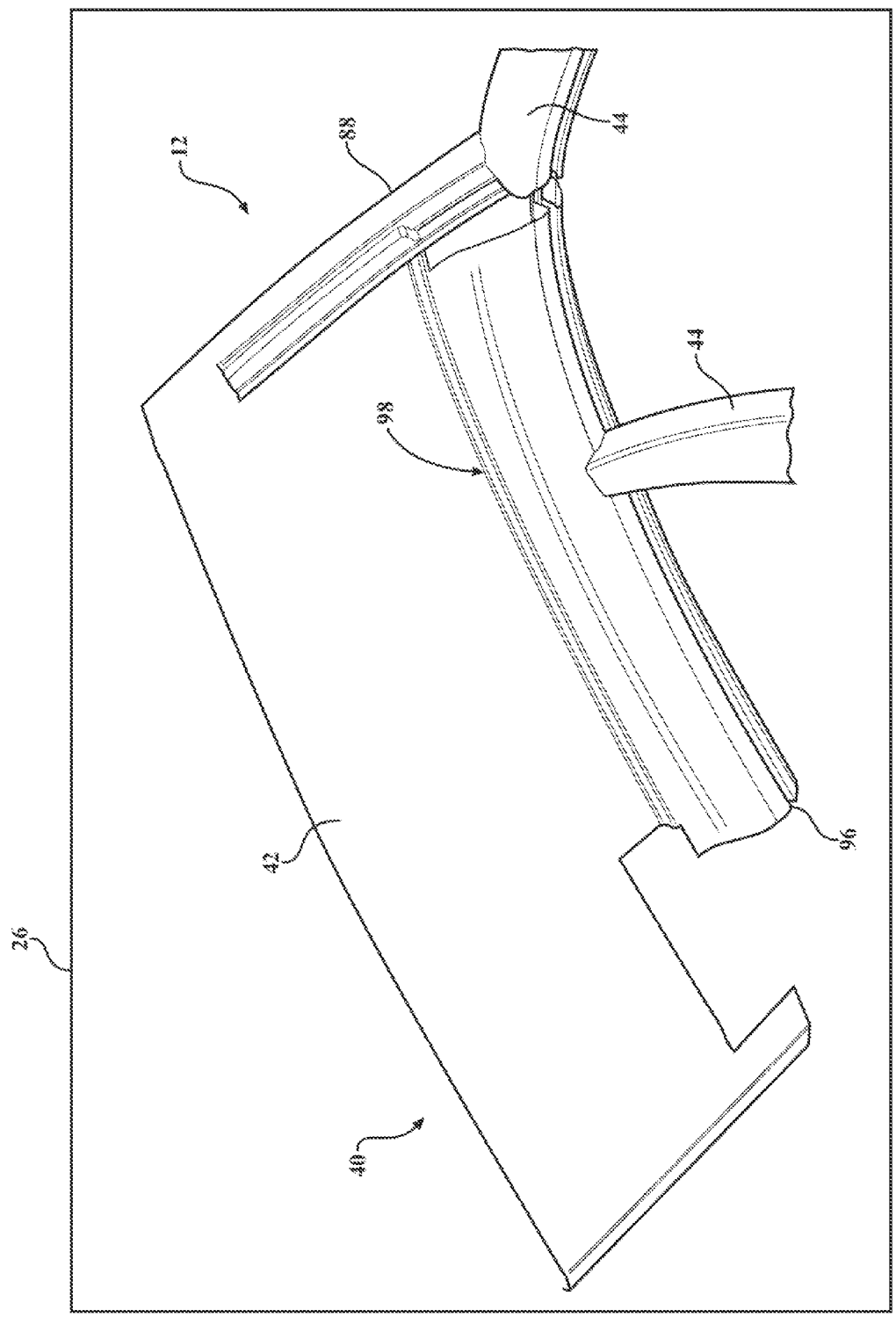
FIG. 17 is a schematic bottom perspective view of the first interior surface of the first specific vehicle being displayed on the display device.

Generally, the interior surface 12 is displayed on the display device 26 as shown in FIGS. 16 and 17. More specifically, the method 1000 also includes displaying, at block 1038, the interior surface 12 representing the interior surface data of the configuration of the specific vehicle 82 corresponding to the general criteria of the selected one of the identifiers 84 and the exterior surface data 112 of the selected desired location on the display device 26. More specifically, in certain embodiments, displaying, at block 1038, the interior surface 12 representing the interior surface data of the configuration of the specific vehicle 82 can include displaying the interior surface 12 as a three-dimensional configuration on the display device 26 (see FIGS. 3, 16 and 17). The interior surface 12 can be configured as one or more of the interior components 40, such as the headliner 42 and/or the trim pieces 44, etc., as discussed above. Therefore, the three-dimensional configuration of the interior surface 12 can be configured as at least one of the headliner 42 and/or one or more trim pieces 44, etc. As such, displaying the interior surface 12 as a three-dimensional configuration can include displaying the headliner 42 and one or more trim pieces 44 on the display device 26 as shown in FIGS. 16 and 17. It is to be appreciated that only half of the exterior surface 114 is being displayed in FIGS. 8-15 and correspondingly, only half of the interior surface 12 is being displayed in FIGS. 16 and 17. It is to also be appreciated that the other half of the interior surface 12 can be mirrored to illustrate the entire headliner 42, and/or trim pieces 44, etc.

Furthermore, in certain embodiments, displaying, at block 1038, the interior surface 12 representing the interior surface data of the configuration of the specific vehicle 82 can include displaying the interior surface 12 representing the interior surface data of the first desired location and the interior surface data of the second desired location of the configuration of the specific vehicle 82. Specifically, in certain embodiments, displaying, at block 1038, the interior surface 12 representing the interior surface data of the configuration of the specific vehicle 82 can include displaying the interior surface 12 representing the interior surface data of the first and second desired locations of the configuration of the specific vehicle 82 as a three-dimensional configuration on the display device 26 as shown in FIGS. 16 and 17. More specifically, displaying, at block 1038, the interior surface 12 representing the interior surface data of the configuration of the specific vehicle 82 can include displaying the interior surface 12 representing the interior surface data of the first desired location of the configuration of the specific vehicle 82 corresponding to the general criteria of the selected first identifier 84 and the exterior surface data 112 of the first desired location on the display device 26. And, displaying, at block 1038, the interior surface 12 representing the interior surface data of the configuration of the specific vehicle 82 can include displaying the interior surface 12 representing the interior surface data of the second desired location of the configuration of the specific vehicle 82 corresponding to the general criteria of the selected second identifier 84 and the exterior surface data 112 of the second desired location on the display device 26. Therefore, the interior surface 12 representing the interior surface data of the first and second desired locations of the configuration of the specific vehicle 82 can be displayed corresponding to the general criteria of the selected first and second identifiers 84 respectively and the exterior surface data 112 of the first and second desired locations respectively.

In addition, referring to FIG. 26, the method 1000 can include storing, at block 1040, the interior surface data of the configuration of the specific vehicle 82 in the memory 20 of the host machine 18. In other words, after the interior surface data is determined, this interior surface data can be stored in the memory 20 of the host machine 18. Therefore, when desired, other users 16 can access this interior surface data. In certain embodiments, storing, at block 1040, the interior surface data of the configuration of the specific vehicle 82 can include storing the interior surface data of the first desired location and the interior surface data of the second desired location of the configuration of the specific vehicle 82 in the memory 20 of the host machine 18. In other words, after the interior surface data of the first and second desired locations are determined, the interior surface data of the first and second desired locations can be stored in the memory 20 of the host machine 18. Therefore, when desired, other users 16 can access this interior surface data. The users 16 can access the stored interior surface data by utilizing a menu, or any other suitable icon etc.

As discussed above, when desired, more than one interior surface 12, 134 can be generated for the same vehicle. Therefore, this below discussion is when the user 16 desires to change the interior surface 12 of the vehicle compartment 14, as generated above, to a different interior surface 134 of the same vehicle (also see FIGS. 18-20 and 26 for this discussion). Thus, the interior surface 12 discussed above is referred to as a first interior surface 12 below and the different interior surface 134 is referred to as a second interior surface 134 below. Generally, the first and second interior surfaces 12, 134 are different from each other. Also, the first and second interior surfaces 12, 134 can be partially or completely different from each other. Furthermore, any number of different interior surfaces 12, 134 can be generated for the same vehicle. When generating another interior surface 134 for the same vehicle, the general template 78 as discussed above is duplicated or copied; and therefore the general template 78 remains the same. Therefore, details of providing, at block 1002, the identifiers 84 representing components 46 of the generic vehicle 80 and providing 1004 general criteria for each of the identifiers 84 of the generic vehicle 80, and associating, at block 1006, each of the general criteria with the respective identifier 84 to define the general template 78 will not be re-discussed.

Preliminarily, the method 1000 can include removing, at block 1042, the first interior surface 12 from the display device 26. Furthermore, storing, at block 1016, exterior surface data 112, 136 of a configuration of the specific vehicle 82 in the memory 20 of the host machine 18 can include storing first exterior surface data 112 of a first configuration of the specific vehicle 82 in the memory 20 of the host machine 18 and storing second exterior surface data 136 (see FIG. 7) of a second configuration of the specific vehicle 82 in the memory 20 of the host machine 18. Simply stated, the first exterior surface data 112 and the second exterior surface data 136 of the specific vehicle 82 are stored in the memory 20 to be accessed by the user 16 when desired. Generally, the first exterior surface data 112 is different from the second exterior surface data 136. Also, the first exterior surface data 112 and the second exterior surface data 136 can be partially or completely different from each other.

In addition, receiving, at block 1018, a selection from the user 16 for the exterior surface data 112, 136 of the configuration of the specific vehicle 82 from the memory 20 of the host machine 18 can include receiving a selection from the user 16 for one of the first exterior surface data 112 of the first configuration of the specific vehicle 82 and the second exterior surface data 136 of the second configuration of the specific vehicle 82 from the memory 20 of the host machine 18. Furthermore, receiving a selection from the user 16 for one of the first exterior surface data 112 and the second exterior surface data 136 can include receiving a selection from the user 16 for the second exterior surface data 136 of the second configuration of the specific vehicle 82 from the memory 20 of the host machine 18. Generally, the user 16 can access the first exterior surface data 112 or the second exterior surface data 136 by utilizing the menu 110 as shown in FIG. 7. With regard to FIG. 7, the first exterior surface data 112 is identified separately from the second exterior surface data 136. In addition, the menu 110 can be displayed on the display device 26 and can be further defined as a drop-down menu or any other suitable menu to access the first exterior surface data 112 or the second exterior surface data 136.

Figure 18:
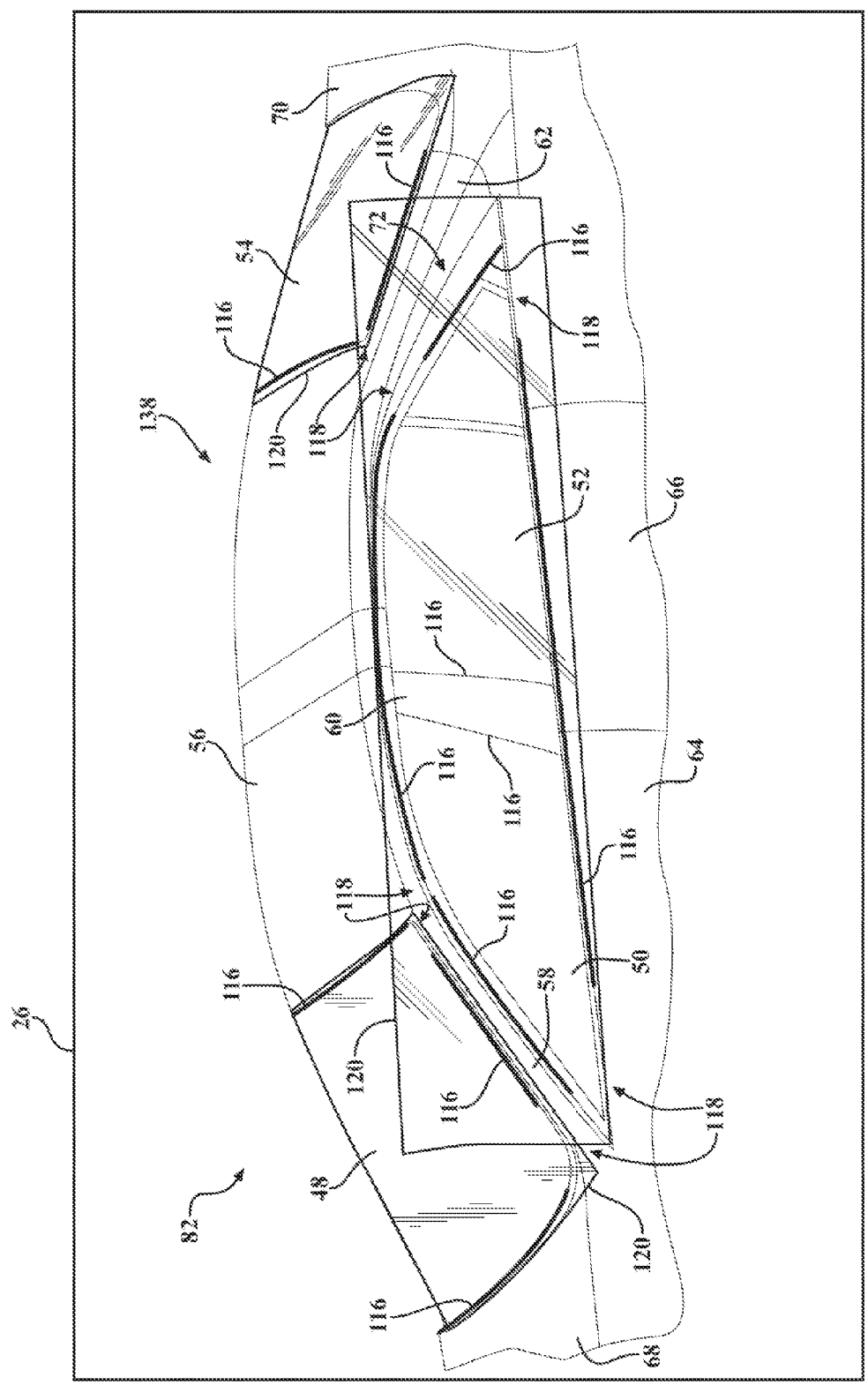
FIG. 18 is a schematic perspective view of a second exterior surface of the first specific vehicle being displayed on the display device.
Figure 19:
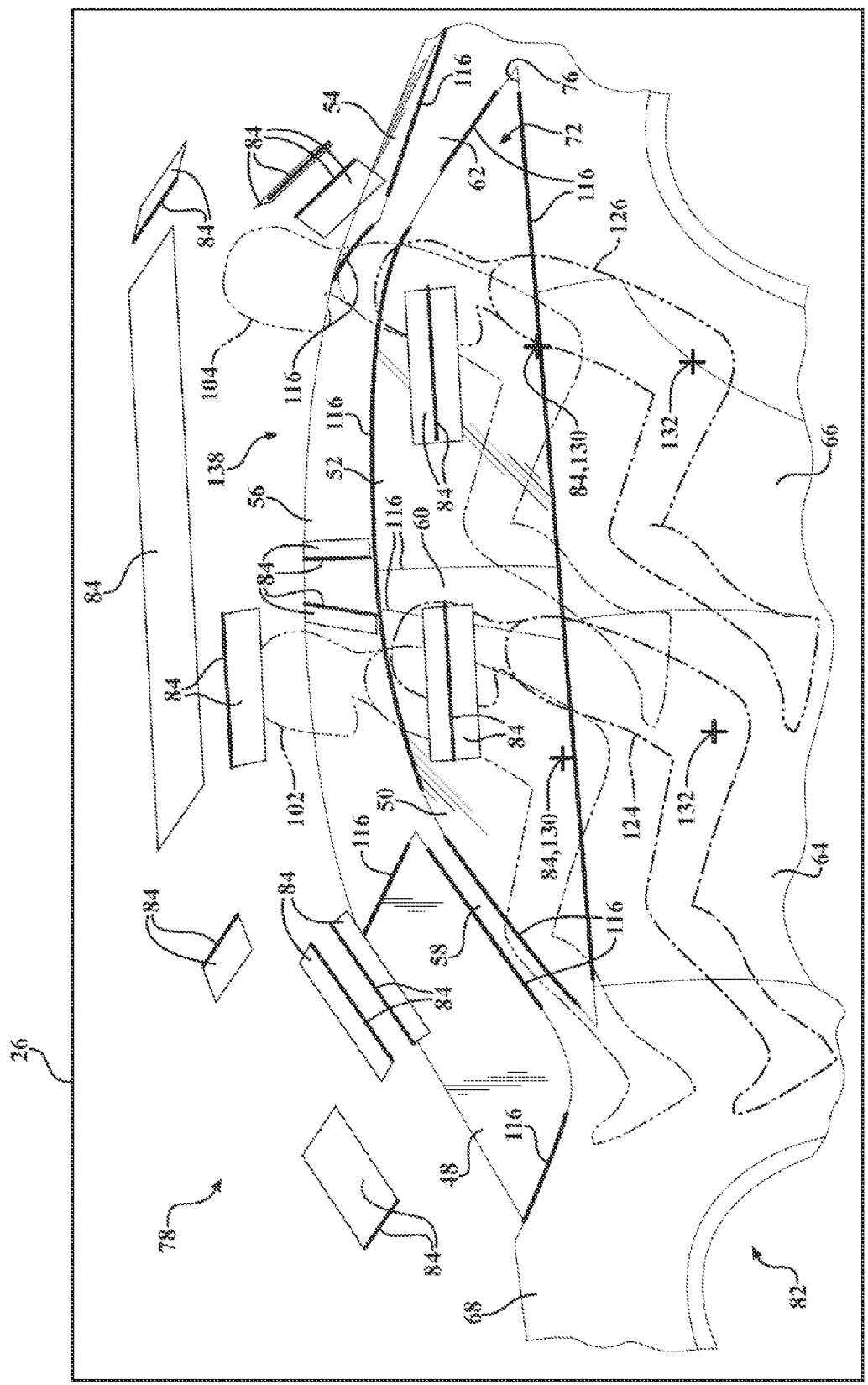
FIG. 19 is a schematic perspective view of the general template and the second exterior surface of the first specific vehicle being displayed on the display device.

Furthermore, displaying, at block 1020, an exterior surface 114, 138 representing the selected exterior surface data 112 of the configuration of the specific vehicle 82 can include displaying one of a first exterior surface 114 of the first configuration of the specific vehicle 82 and a second exterior surface 138 of the second configuration of the specific vehicle 82 representing the selected one of the first exterior surface data 112 and the second exterior surface data 136. More specifically, displaying one of the first and second exterior surfaces 114, 138 can include displaying the second exterior surface 138 representing the selected second exterior surface data 136 of the second configuration of the specific vehicle 82 as shown in FIGS. 18 and 19. Simply stated, when a selection is received from the user 16 for the second exterior surface data 136, the second exterior surface 138 is displayed instead of the first exterior surface 114. In one embodiment, the second exterior surface 138 is displayed as a three-dimensional configuration on the display device 26 as shown in FIGS. 18 and 19. When both the general template 78 and the second exterior surface data 136 is selected, both can be displayed on the display device 26 as shown in FIG. 19.

In addition, receiving, at block 1030, a selection from the user 16 for one of the identifiers 84 of the general template 78 and receiving, at block 1032, a selection from the user 16 for a desired location of the exterior surface 114, 138 of the specific vehicle 82 can include receiving a selection from the user 16 for one of the identifiers 84 of the general template 78 and receiving a selection from the user 16 for a desired location of the second exterior surface 138 of the specific vehicle 82 to associate the general criteria for the selected one of the identifiers 84 with the second exterior surface data 136 of the selected desired location. As discussed above, any suitable number of selections can be received from the user 16 for one of the identifiers 84 and one of the desired locations. Details of selecting the identifiers 84 and selecting the desired locations are discussed above and apply here. Therefore, selecting the identifiers 84 and the desired locations will not be re-discussed for the second configuration of the specific vehicle 82. Again, the pattern of selecting identifiers 84 and desired locations are repeated until all of the identifiers 84 have been associated with respective desired locations; and thus all of the identifiers 84 will be removed from the display device 26 once all of the associations have been made.

Furthermore, storing, at block 1024, the specific occupant location data 122, 140 in the memory 20 can include storing first specific occupant location data 122 and second specific occupant location data 140 (see FIG. 7) in the memory 20 of the host machine 18. In other words, storing, at block 1024, the specific occupant location data 122, 140 can include storing second specific occupant location data 140 in the memory 20 of the host machine 18. Generally, the second specific occupant location data 140 is different from the first specific occupant location data 122. Also, the first specific occupant location data 122 and the second occupant location data 140 can be partially or completely different from each other. Details of the first specific occupant location data 122 are discussed above and apply to the second specific occupant location data 140; therefore, the details will not be re-discussed.

Receiving, at block 1026, a selection from the user 16 for the specific occupant location data 122, 140 of the configuration of the specific vehicle 82 from the memory 20 of the host machine 18 can include receiving a selection from the user 16 for one of the first specific occupant location data 122 and the second specific occupant location data 140. In one embodiment, receiving a selection from the user 16 for one of the first specific occupant location data 122 and the second specific occupant location data 140 can include receiving a selection from the user 16 for the first specific occupant location data 122. In another embodiment, receiving a selection from the user 16 for one of the first specific occupant location data 122 and the second specific occupant location data 140 can include receiving a selection from the user 16 for the second specific occupant location data 140. Therefore, as shown in FIG. 19, when the second specific occupant location data 140 is selected, the first and second specific occupants 124, 126 of the second specific occupant location data 140 are displayed on the display device 26 instead of the first specific occupant location data 122 as discussed further below. Generally, the user 16 can access the first and second specific occupant location data 122, 140 by utilizing the menu 110 as shown in FIG. 7. Also, the menu 110 can be displayed on the display device 26 and can be further defined as a drop-down menu or any other suitable menu to access the first or second specific occupant location data 122, 140.

Displaying, at block 1028, the first and second specific occupants 124, 126, representing the specific occupant location data 122, 140, after selecting the specific occupant location data 122, 140 can include displaying the first and second specific occupants 124, 126, representing one of the first specific occupant location data 122 and the second specific occupant location data 140, after selecting one of the first specific occupant location data 122 and the second specific occupant location data 140. As such, for example, the general template 78, including the identifiers 84, the second exterior surface 138 representing the selected second exterior surface data 136, and the first and second specific occupants 124, 126 representing the selected one of the first specific occupant location data 122 and the second specific occupant location data 140 can be displayed on the display device 26. In one embodiment, displaying the first and second specific occupants 124, 126, representing one of the first specific occupant location data 122 and the second specific occupant location data 140 can include displaying the first specific occupant location data 122. In another embodiment, displaying the first and second specific occupants 124, 126, representing one of the first specific occupant location data 122 and the second specific occupant location data 140 can include displaying the second specific occupant location data 140. Therefore, the general template 78, including the identifiers 84, the second exterior surface 138 representing the selected second exterior surface data 136, and the first and second specific occupants 124, 126 representing the selected second specific occupant location data 140 can be displayed on the display device 26 as shown in FIG. 19.

Furthermore, determining, at block 1034, interior surface data of the selected desired location can include determining one of first interior surface data and second interior surface data. More specifically, determining one of the first interior surface data and the second interior surface data can include determining second interior surface data of the selected desired location, via the host machine 18, as a function of the general criteria of the selected one of the identifiers 84 and the second exterior surface data 136 of the selected desired location. In other words, determining, at block 1034, interior surface data of the selected desired location can include determining second interior surface data of the selected desired location, via the host machine 18, as a function of the general criteria of the selected one of the identifiers 84 and the second exterior surface data 136 of the selected desired location. Furthermore, determining second interior surface data of the selected desired location can include calculating the second interior surface data from the general criteria of the selected one of the identifiers 84 and the second exterior surface data 136 of the selected desired location. Generally, the first interior surface data is different from the second interior surface data. In addition, the first interior surface data and the second interior surface data can be partially or completely different from each other.

In certain embodiments, determining second interior surface data of the selected desired location can include determining second interior surface data of at least one of the first and second desired locations, via the host machine 18, as a function of the general criteria of at least one of the selected first and second identifiers 84 and the second exterior surface data 136 of at least one of the first and second desired locations. Furthermore, in certain embodiments, determining second interior surface data of at least one of the first and second desired locations can include determining second interior surface data of the first desired location, via the host machine 18, as a function of the general criteria of the selected first identifier 84 and the second exterior surface data 136 of the first desired location. Therefore, the second interior surface data of the first desired location is determined, via the host machine 18, as a function of the general criteria of the selected first identifier 84 and the second exterior surface data 136 of the first desired location. In addition, in certain embodiments, determining second interior surface data of at least one of the first and second desired locations can include determining second interior surface data of the second desired location, via the host machine 18, as a function of the general criteria of the selected second identifier 84 and the second exterior surface data 136 of the second desired location. Therefore, the second interior surface data of the second desired location is determined, via the host machine 18, as a function of the general criteria of the selected second identifier 84 and the second exterior surface data 136 of the second desired location.

Furthermore, in certain embodiments, the method can include associating, at block 1044, the second interior surface data of the first desired location and the second interior surface data of the second desired location with one another. In other words, the second interior surface data of the first and second desired locations can cooperate with each other to generate the headliner 42 or the trim pieces 44, etc.

Figure 20:
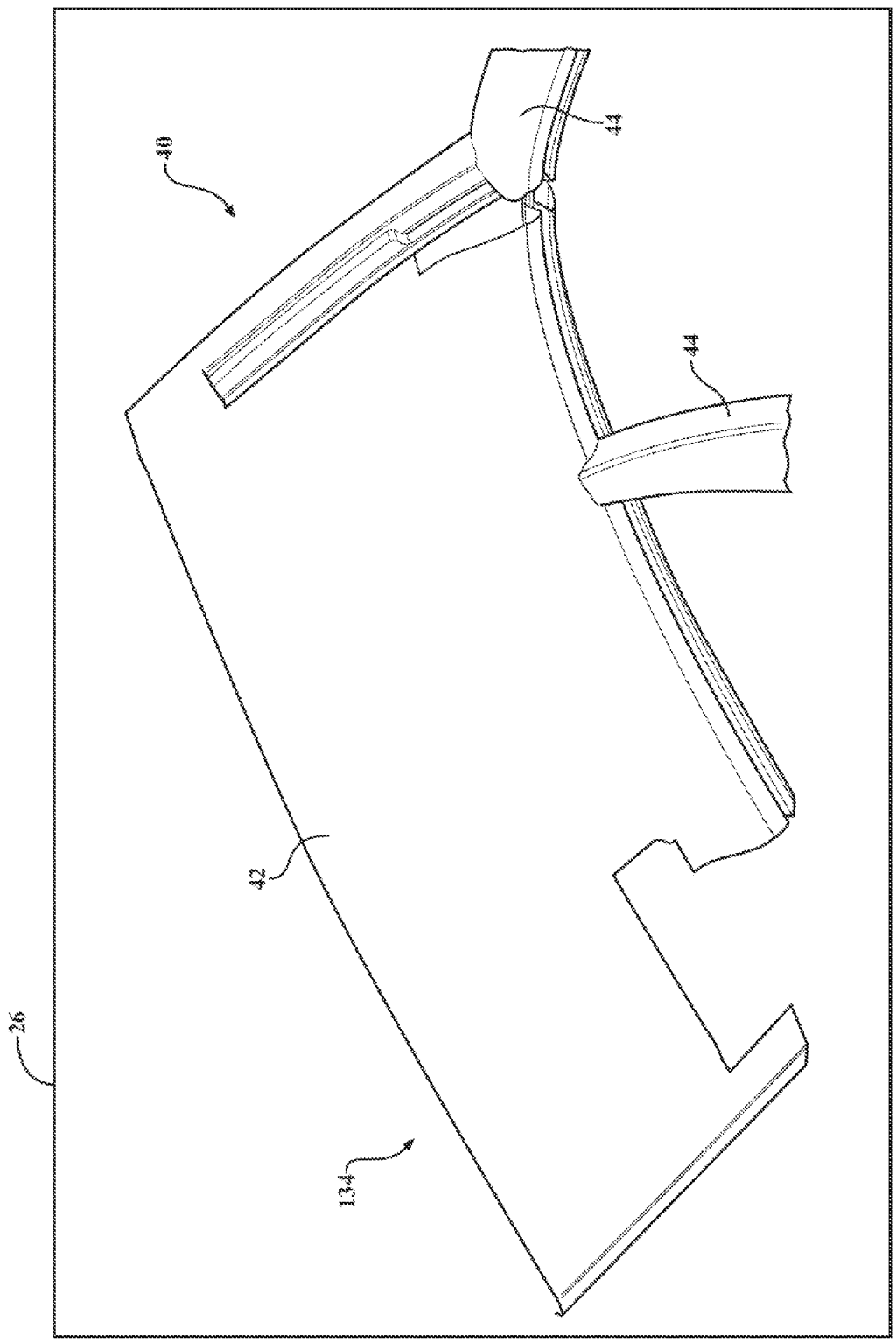
FIG. 20 is a schematic perspective view of a second interior surface of the first specific vehicle being displayed on the display device.

Displaying, at block 1038, the interior surface 12, 134 representing the interior surface data of the configuration of the specific vehicle 82 can include displaying one of the first interior surface 12 representing the first interior surface data of the first configuration of the specific vehicle 82 and a second interior surface 134 (see FIG. 20) representing the second interior surface data of the second configuration of the specific vehicle 82. More specifically, displaying one of the first and second interior surfaces 12, 134 can include displaying the second interior surface 134 representing the second interior surface data of the second configuration of the specific vehicle 82 corresponding to the general criteria of the selected one of the identifiers 84 and the second exterior surface data 136 of the selected desired location on the display device 26. More specifically, displaying the second interior surface 134 representing the second interior surface data of the second configuration of the specific vehicle 82 can include displaying the second interior surface 134 as a three-dimensional configuration on the display device 26 as shown in FIG. 20. For illustrative purposes only, the second interior surface 134 displayed in FIG. 20 is different from the first interior surface 12 displayed in FIG. 17 with regard to the particular contour 98 at the particular location in the headliner 42 has been eliminated from the second interior surface 134. It is to be appreciated that only half of the second exterior surface 138 is being displayed in FIGS. 18 and 19 and correspondingly, only half of the second interior surface 134 is being displayed in FIG. 20. It is to also be appreciated that the other half of the second interior surface 134 can be mirrored to illustrate the entire headliner 42, and/or trim pieces 44, etc.

The method 1000 can further include storing, at block 1046, the second interior surface data of the second configuration of the specific vehicle 82 in the memory 20 of the host machine 18. In other words, after the second interior surface data is determined, this second interior surface data can be stored in the memory 20 of the host machine 18. Therefore, when desired, other users 16 can access the first interior surface data of the first configuration of the specific vehicle 82 or the second interior surface data of the second configuration of the same specific vehicle 82. One or more lines or curves 116 can be displayed along the second exterior surface 138 to represent the second exterior surface data 136 as discussed in detail above for the first configuration of the specific vehicle 82. Optionally, the glass projection area 120 can be displayed on the display device 26 for the second configuration of the vehicle specific 82 as discussed in detail above for the first configuration of the specific vehicle 82.

As discussed above, when desired, the interior surface 12, 134, 142 can be generated for different vehicles. Thus, this below discussion is when the user 16 desires to generate an interior surface 142 of a vehicle compartment 144 of a different vehicle. Therefore, the specific vehicle 82 discussed above will be referred to as a first specific vehicle 82 below and the different vehicle will be referred to as a second specific vehicle 146 below. Furthermore, the interior surfaces 12, 134 discussed above will be referred to as the first and second interior surfaces 12, 134 below and the interior surface 142 generated for the second specific vehicle 146 will be referred to as a third interior surface 142. Generally, the first and second specific vehicles 82, 146 are different from each other. Also, the first and second specific vehicles 82, 146 can be partially or completely different from each other. Furthermore, any number of interior surfaces 12, 134, 142 can be generated for any number of different vehicles. See FIGS. 21-25 and 26 for this discussion.

The generic vehicle 80 as discussed above will be referred to as a first generic vehicle 80 and the general template 78 as discussed above will be referred to as a first general template 78 for the first specific vehicle 82. Referring to FIG. 26, the method 1000 can include removing, at block 1048, one of the first interior surface 12 representing the first interior surface data of the first configuration of the first specific vehicle 82 and the second interior surface 134 representing the second interior surface data of the second configuration of the first specific vehicle 82 from the display device 26.

Figure 21:
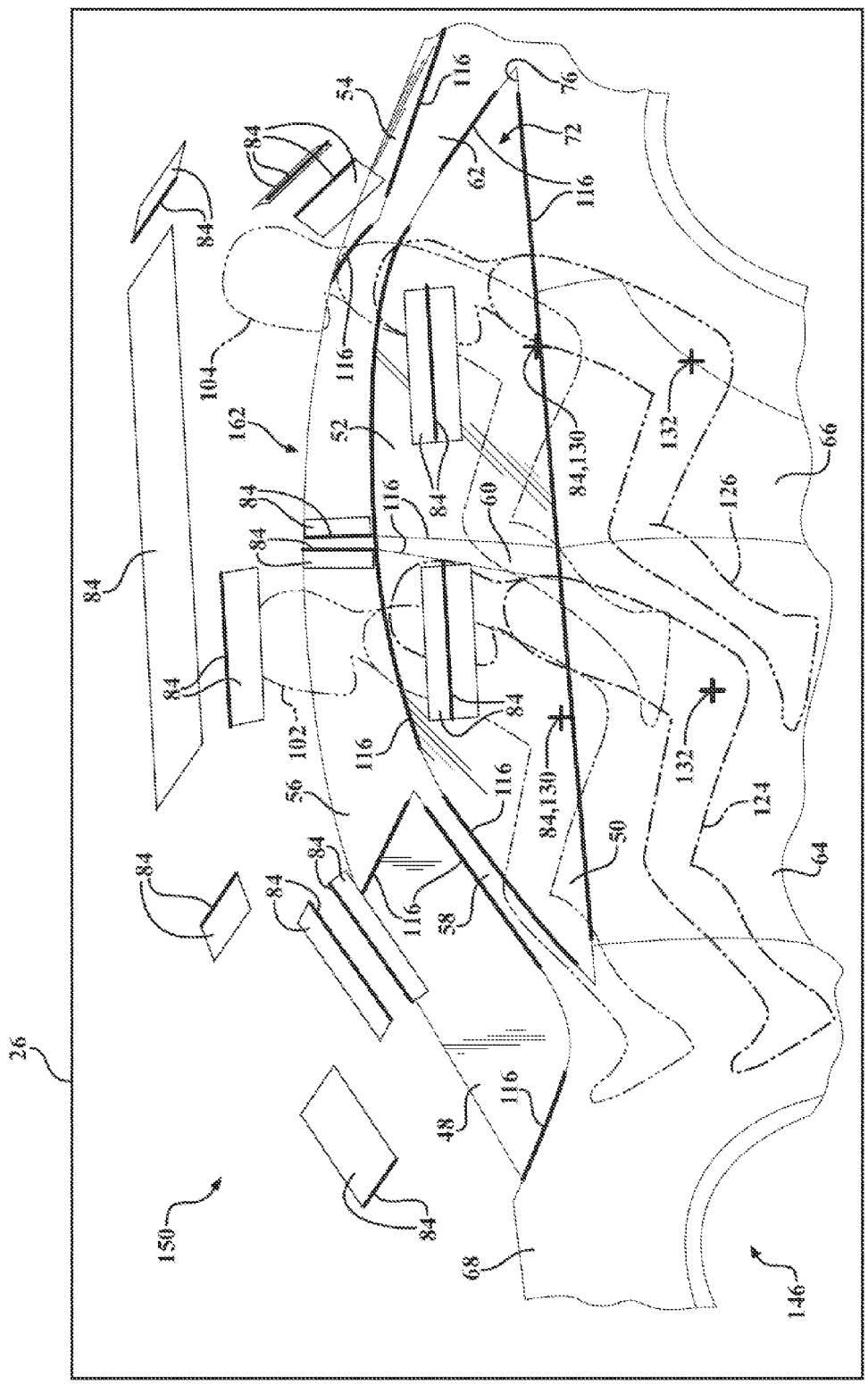
FIG. 21 is a schematic perspective view of a second general template and an exterior surface of a second specific vehicle being displayed on the display device.
Figure 22:
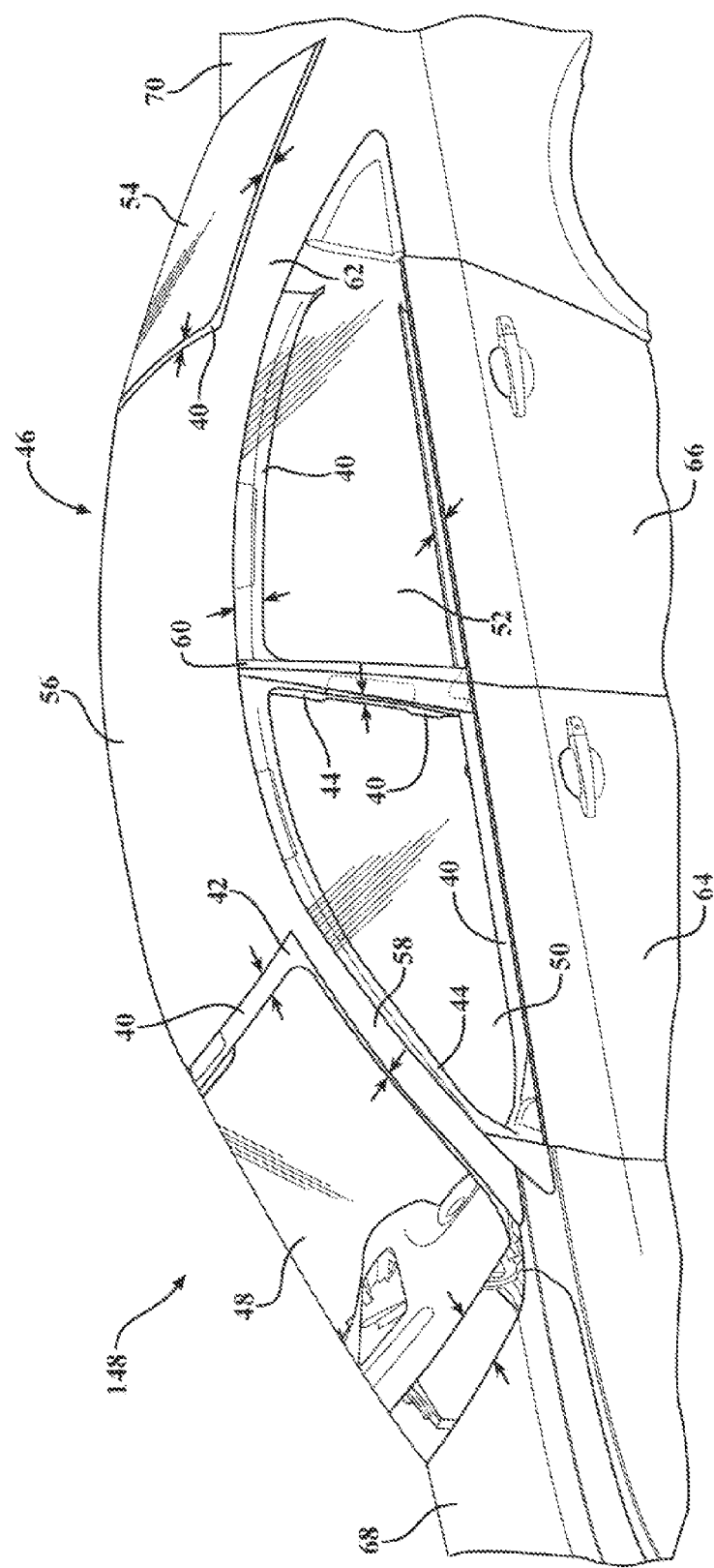
FIG. 22 is a schematic perspective view of a second generic vehicle.

Referring to FIGS. 21 and 26, the method 1000 can further include providing, at block 1050, a plurality of identifiers 84 representing components 46 of a second generic vehicle 148 (see FIG. 22 for the second generic vehicle 148) and providing, at block 1052, general criteria for each of the identifiers 84 of the second generic vehicle 148. Generally, the identifiers 84 and the general criteria are tailored to the second generic vehicle 148. Therefore, details of the identifiers 84 and the general criteria have been discussed above for the first generic vehicle 80 and will not be re-discussed.

Furthermore, the method 1000 can include associating, at block 1054, each of the general criteria with the respective identifier 84 of the second generic vehicle 148 to define a second general template 150. Simply stated again, the second general template can include the identifiers 84 and the general criteria as discussed above, with the identifiers 84 and the general criteria tailored to this second generic vehicle 148. In certain embodiments, the first general template 78 can be copied and modified to create the second general template 150 for the second generic vehicle 148. As such, the general criteria of the first general template 78 can be modified to accommodate the second generic vehicle 148, with the modified general criteria associated with the respective identifier 84 to define the second general template 150 for the second specific vehicle 146.

The method 1000 can further include storing, at block 1056, the second general template 150 in the memory 20 of the host machine 18 and storing, at block 1058, exterior surface data 152 of a configuration of the second specific vehicle 146 in the memory 20 of the host machine 18. Therefore, after the second general template 150 is created, this template 150 can be stored in the memory 20 such that the users 16 can access the second general template 150 as desired. Furthermore, to generate the third interior surface 142 of the vehicle compartment 144 for the second specific vehicle 146, the exterior surface data 152 of the configuration of the second specific vehicle 146 is stored in the memory 20. Generally, the exterior surface data 152 is pre-determined and stored in the memory 20 to be accessed when desired to generate the third interior surface 142 related to that exterior surface data 152 of the second specific vehicle 146. It is to be appreciated exterior surface data 152 of a first configuration of the second specific vehicle 146 can be stored and exterior surface data 154 of a second configuration of the second specific vehicle 146 can be stored, etc. In other words, more than one exterior surface data 152, 154 of the second specific vehicle 146 can be stored in the memory 20 as similarly discussed above for the first specific vehicle 82.

In certain embodiments, the method 1000 can include receiving, at block 1060, a selection from the user 16 for the second general template 150 to display the second general template 78 on the display device 26 as shown in FIG. 21. It is to be appreciated that the method can include receiving, at block 1062, a selection from the user 16 for general occupant location data 156 to display the first and second occupants 102, 104 on the display device 26 as shown in FIG. 21. Details of the general occupant location data 100, 156 is discussed above and apply here; therefore, the general occupant location data 100, 156 will not be re-discussed.

Furthermore, specific occupant location data 158 of the configuration of the second specific vehicle 146 can be stored in the memory 20 of the host machine 18. Therefore, the method 1000 can further include storing, at block 1064, the specific occupant location data 158 in the memory 20. Details of the specific occupant location data 122, 158 is discussed above and apply here; therefore, the specific occupant location data 122, 158 will not be re-discussed. Storing, at block 1064, the specific occupant location data 158 can occur before displaying the second general template 150. Furthermore, storing, at block 1064, the specific occupant location data 158 can occur before or after storing, at block 1058, the exterior surface data 152 of the configuration of the second specific vehicle 146.

Figure 23:
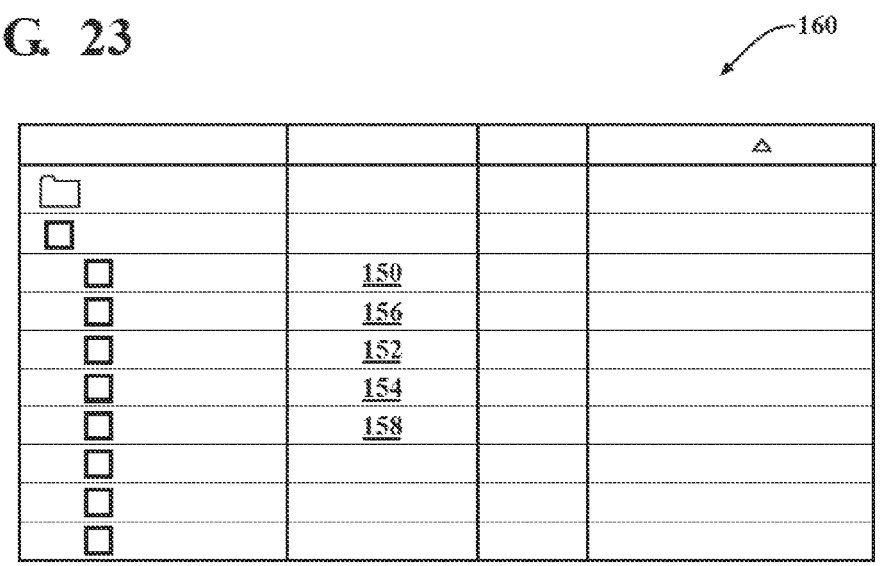
FIG. 23 is a schematic view of a menu.

In certain embodiments, the method 1000 can include receiving, at block 1066, a selection from the user 16 for the specific occupant location data 158 of the configuration of the second specific vehicle 146 from the memory 20 of the host machine 18. Generally, the user 16 can access the specific occupant location data 158 by utilizing a menu 160 as shown in FIG. 23. Also, the menu 160 can be displayed on the display device 26 and can be further defined as a drop-down menu or any other suitable menu to access the specific occupant location data 158.

The method 1000 can also include receiving, at block 1068, a selection from the user 16 for the exterior surface data 152 of the configuration of the second specific vehicle 146 from the memory 20 of the host machine 18. When more than one exterior surface data 152, 154 is available for the second specific vehicle 146, receiving, at block 1068, a selection from the user 16 for the exterior surface data 152, 154 can include receiving a selection from the user 16 for one of the exterior surface data 152 of a first configuration of the second specific vehicle 146 and the exterior surface data 154 of a second configuration of the second specific vehicle 146.

Generally, the user 16 can access the second general template 150, the general occupant location data 156 and the exterior surface data 152, 154 by utilizing the menu 160 as shown in FIG. 23. Also, the menu 160 can be displayed on the display device 26 and can be further defined as a drop-down menu or any other suitable menu to access the second general template 150, the general occupant location data 156 and the exterior surface data 152, 154.

Figure 24:
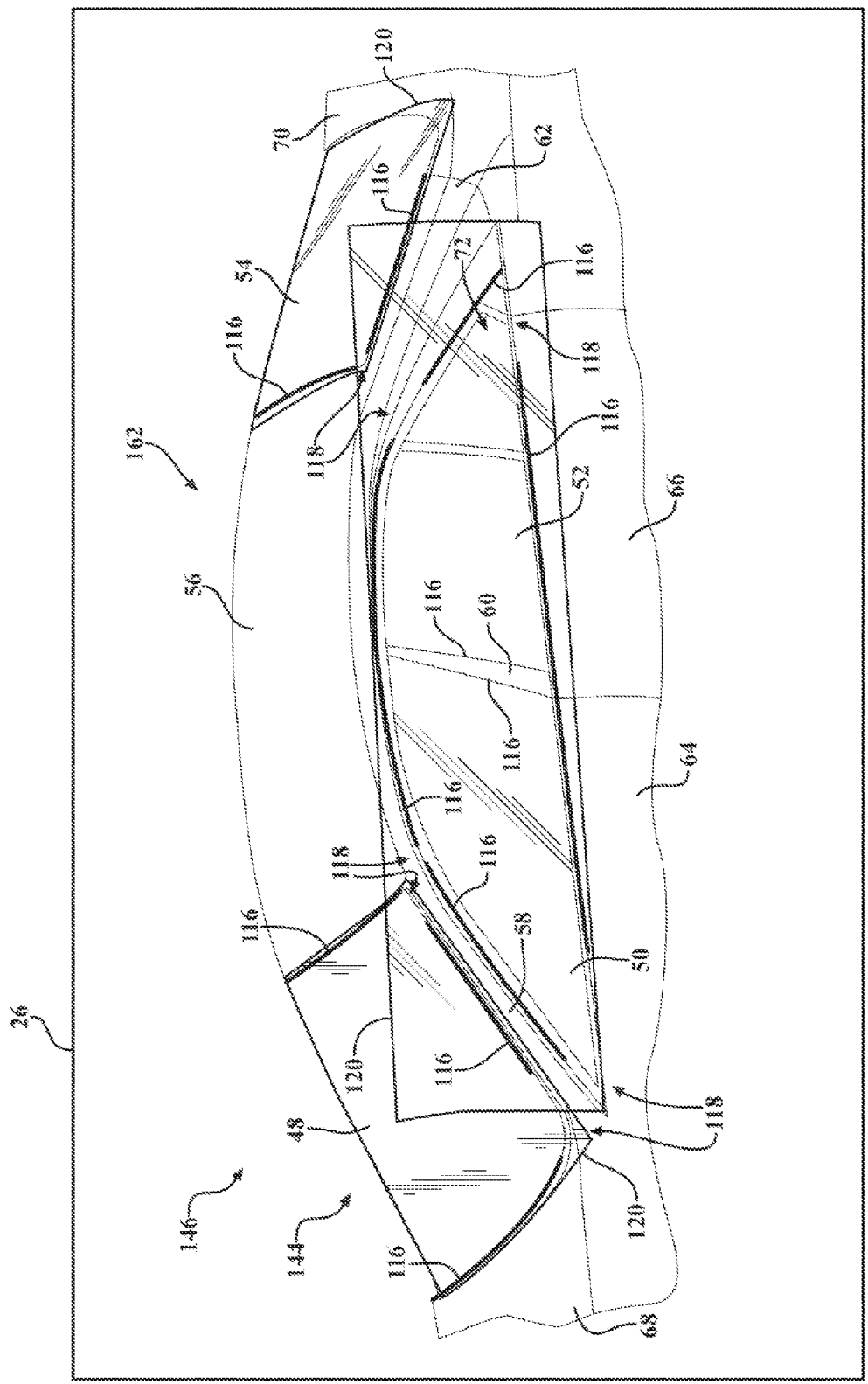
FIG. 24 is a schematic perspective view of the exterior surface of the second specific vehicle being displayed on the display device.

Furthermore, the method 1000 can include displaying, at block 1070, an exterior surface 162 representing the selected exterior surface data 152 of the configuration of the second specific vehicle 146 as shown in FIGS. 21 and 24. In one embodiment, the exterior surface 162 is displayed as a three-dimensional configuration on the display device 26 as shown in FIGS. 21 and 24. The method 1000 can also include displaying, at block 1072, the second general template 150, including the identifiers 84, on the display device 26. FIG. 21 illustrates the exterior surface 162 of the second specific vehicle 146 and the second general template 150 being displayed on the display device 26. Therefore, when the second general template 150 and the exterior surface data 154 of the second specific vehicle 146 are selected, both can be displayed on the display device 26. The method can also include displaying, at block 1074, the first and second specific occupants 124, 126 (see FIG. 21) representing the specific occupant location data 158 on the display device 26, after selecting the specific occupant location data 158.

Referring to FIG. 26, the method 1000 can also include receiving, at block 1076, a selection from the user 16 for one of the identifiers 84 of the second general template 150 and receiving, at block 1078, a selection from the user 16 for a desired location of the exterior surface 162 of the second specific vehicle 146 to associate the general criteria for the selected one of the identifiers 84 with the exterior surface data 152 of the selected desired location. As discussed above, any suitable number of selections can be received from the user 16 for one of the identifiers 84 and one of the desired locations. Details of selecting the identifiers 84 and selecting the desired locations are discussed above and apply here. Therefore, selecting the identifiers 84 and the desired locations will not be re-discussed for the second specific vehicle 146. Again, the pattern of selecting identifiers 84 and desired locations are repeated until all of the identifiers 84 have been associated with respective desired locations; and thus all of the identifiers 84 will be removed from the display device 26 once associated.

In addition, the method 1000 can include determining, at block 1080, interior surface data of the selected desired location, via the host machine 18, as a function of the general criteria of the selected one of the identifiers 84 and the exterior surface data 152 of the selected desired location of the second specific vehicle 146. More specifically, determining interior surface data of the selected desired location of the second specific vehicle 146 can include calculating the interior surface data from the general criteria of the selected identifier 84 and the exterior surface data 152 of the selected desired location of the second specific vehicle 146.

Generally, determining, at block 1080, interior surface data of the selected desired location occurs after receiving, at block 1076, a selection from the user 16 for one of the identifiers 84 and receiving, at block 1078, a selection from the user 16 for the desired location. In certain embodiments, determining, at block 1080, interior surface data of the selected desired location can include determining interior surface data of at least one of the first and second desired locations, via the host machine 18, as a function of the general criteria of at least one of the selected first and second identifiers 84 and the exterior surface data 152 of at least one of the first and second desired locations.

Furthermore, in certain embodiments, determining interior surface data of at least one of the first and second desired locations can include determining interior surface data of the first desired location, via the host machine 18, as a function of the general criteria of the selected first identifier 84 and the exterior surface data 152 of the first desired location. Therefore, the interior surface data of the first desired location is determined, via the host machine 18, as a function of the general criteria of the selected first identifier 84 and the exterior surface data 152 of the first desired location. In addition, in certain embodiments, determining interior surface data of at least one of the first and second desired locations can include determining interior surface data of the second desired location, via the host machine 18, as a function of the general criteria of the selected second identifier 84 and the exterior surface data 152 of the second desired location. Therefore, the interior surface data of the second desired location is determined, via the host machine 18, as a function of the general criteria of the selected second identifier 84 and the exterior surface data 152 of the second desired location.

Figure 25:
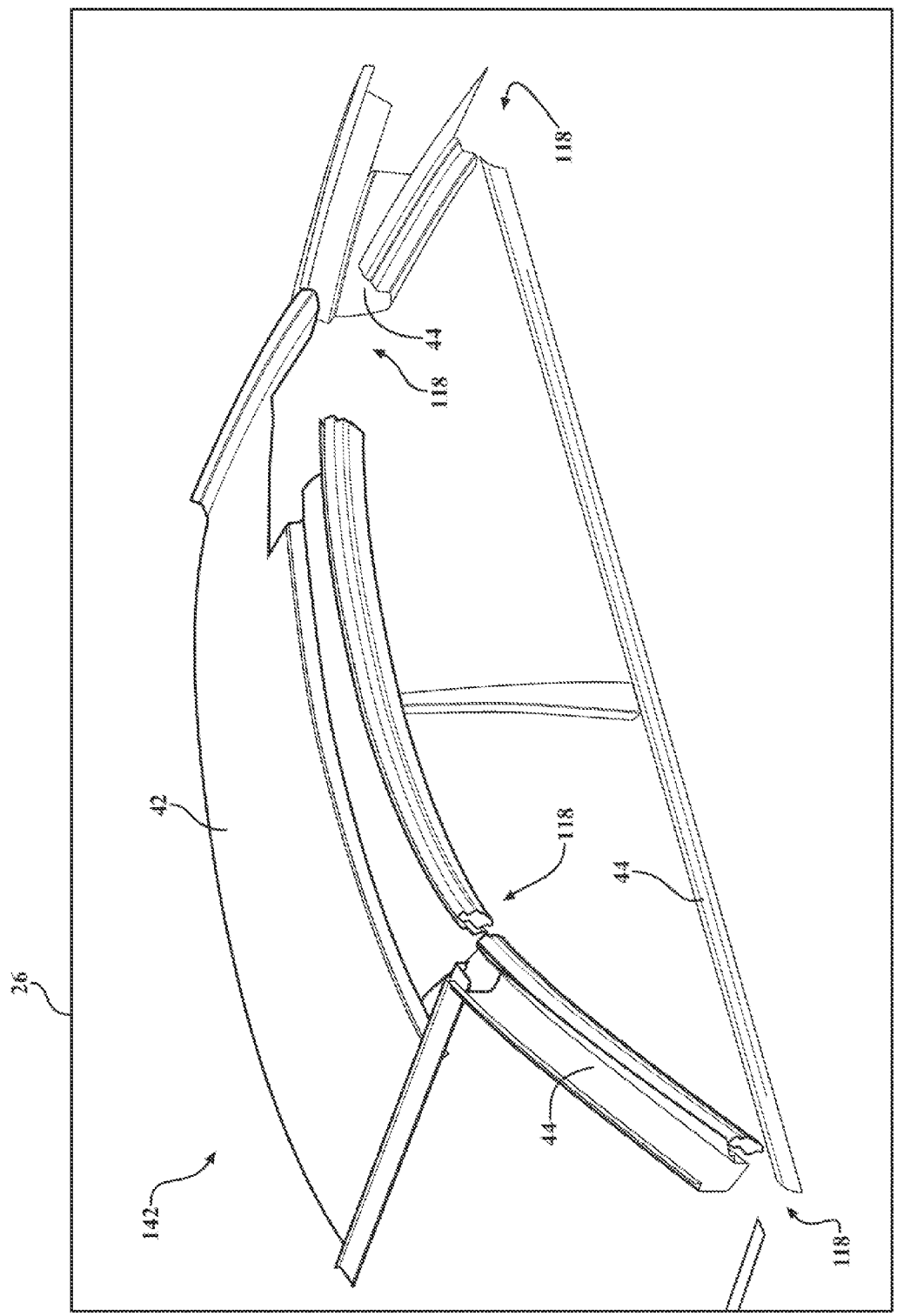
FIG. 25 is a schematic perspective view of an interior surface of the second specific vehicle being displayed on the display device.

The method 1000 can also include displaying, at block 1082, the third interior surface 142 representing the interior surface data of the configuration of the second specific vehicle 146 corresponding to the general criteria of the selected one of the identifiers 84 and the exterior surface data 152 of the selected desired location on the display device 26. More specifically, in certain embodiments, displaying, at block 1082, the third interior surface 142 representing the interior surface data of the configuration of the second specific vehicle 146 can include displaying the third interior surface 142 as a three-dimensional configuration on the display device 26 (see FIG. 25). The third interior surface 142 can be configured as one or more of the interior components 40, such as the headliner 42 and/or the trim pieces 44, etc., as discussed above. Therefore, the three-dimensional configuration of the third interior surface 142 can be configured as at least one of the headliner 42 and/or one or more trim pieces 44, etc. As such, displaying the third interior surface 142 as a three-dimensional configuration can include displaying the headliner 42 and one or more trim pieces 44 on the display device 26 as shown in FIG. 25. It is to be appreciated that only half of the exterior surface 162 is being displayed in FIGS. 21 and 24 and correspondingly, only half of the third interior surface 142 is being displayed in FIG. 25. It is to also be appreciated that the other half of the third interior surface 142 can be mirrored to illustrate the entire headliner 42, and/or trim pieces 44, etc. Additional details of displaying are discussed above for the first specific vehicle 82 and will not be re-discussed.

In addition, referring to FIG. 26, the method 1000 can include storing, at block 1084, the interior surface data of the configuration of the second specific vehicle 146 in the memory 20 of the host machine 18. In other words, after the interior surface data is determined, this interior surface data can be stored in the memory 20 of the host machine 18. Therefore, when desired, other users 16 can access this interior surface data. The users 16 can access the stored interior surface data by utilizing a menu, or any other suitable icon etc. Additional details of storing are discussed above for the first specific vehicle 82 and will not be re-discussed.

Referring to FIG. 27, the present disclosure also provides another method 2000 generating the interior surface 12 of the vehicle compartment 14. The method 2000 includes storing, at block 2002, the general template 78 in the memory 20 of the host machine 18, with the general template 78 including the plurality of identifiers 84 representing components 46 of the generic vehicle 80 and the general template 78 including general criteria for each of the identifiers 84 of the generic vehicle 80. Therefore, in this method 2000, the general template 78 has already been created for the users 16 to access. Specifics of the general template 78, the identifiers 84 and the general criteria are discussed above for the method 1000.

The method 2000 also includes storing, at block 2004, exterior surface data 112 of the configuration of the specific vehicle 82 in the memory 20 of the host machine 18. See the above method 1000 for additional details of the exterior surface data 112. Therefore, the exterior surface data 112 and storing, at block 2004, the exterior surface data 112 will not be discussed further here.

The method 2000 further includes receiving, at block 2006, a selection from the user 16 for the exterior surface data 112 of the configuration of the specific vehicle 82 from the memory 20 of the host machine 18. See the above method 1000 for additional details of the selection of the exterior surface data 112. Therefore, selecting the exterior surface data 112 will not be discussed further here.

The method 2000 also includes displaying, at block 2008, the exterior surface 114 representing the selected exterior surface data 112 of the configuration of the specific vehicle 82 as the three-dimensional configuration on the display device 26. See the above method 1000 for additional details of displaying the selected exterior surface data 112. Therefore, the exterior surface 114 and displaying, at block 2008, the exterior surface 114 will not be discussed further here.

The method 2000 further includes displaying, at block 2010, the general template 78, including the identifiers 84, on the display device 26. See the above method 1000 for additional details of displaying the general template 78. Therefore, displaying, at block 2010, the general template 78 will not be discussed further here.

The method 2000 further includes receiving, at block 2012, a selection from the user 16 for one of the identifiers 84 of the general template 78 and receiving, at block 2014, a selection from the user 16 for a desired location of the exterior surface 114 of the specific vehicle 82 to associate the general criteria for the selected one of the identifiers 84 with the exterior surface data 112 of the selected desired location. See the above method 1000 for additional details of receiving a selection from the user 16 for one of the identifiers 84 and the desired location. Therefore, receiving, at block 2012, at block 2014, a selection from the user 16 for one of the identifiers 84 and the desired location will not be discussed further here.

The method 2000 further includes determining, at block 2016, interior surface data of the selected desired location, via the host machine 18, as a function of the general criteria of the selected one of the identifiers 84 and the exterior surface data 112 of the selected desired location. See the above method 1000 for additional details of determining interior surface data. Therefore, determining, at block 2016, the interior surface data will not be discussed further here.

The method 2000 further includes displaying, at block 2018, the interior surface 12 representing the interior surface data of the configuration of the specific vehicle 82 corresponding to the general criteria of the selected one of the identifiers 84 and the exterior surface data 112 of the selected desired location on the display device 26. See the above method 1000 for additional details of displaying the interior surface 12. Therefore, displaying, at block 2018, the interior surface 12 will not be discussed further here. It is to be appreciated that the method 2000 can include other features detailed in the method 1000 above.

Furthermore, it is to also be appreciated that the order or sequence of performing the methods 1000, 2000 as identified in the flowcharts of FIGS. 26 and 27 are for illustrative purposes and other orders or sequences are within the scope of the present disclosure. It is to also be appreciated that the methods 1000, 2000 can include other features not specifically identified in the flowcharts of FIGS. 26 and 27.

Briefly, the methods 1000, 2000 provide a quick and easy way to generate the interior surface 12, 134, 142 utilizing the host machine 18 without having to wait for a full-sized replica to be developed as discussed in the background section above. Therefore, by utilizing this method 1000, 2000 early in a vehicle development, the users 16 will be able to determine whether adjustments to the vehicle, such as the upper portion 72 or greenhouse, should be made which can make vehicle development more efficient. In addition, the methods 1000, 2000 provide consistent alignment of the headliner 42 relative to the trim pieces 44 of the generated interior surfaces 12, 34, 142 when changes are made.

While the best modes for carrying out the disclosure have been described in detail, those familiar with the art to which this disclosure relates will recognize various alternative designs and embodiments for practicing the disclosure within the scope of the appended claims.

The invention claimed is:

1. A method of generating an interior surface of a vehicle compartment, the method comprising:
   providing a plurality of identifiers representing components of a generic vehicle;
   providing general criteria for each of the identifiers of the generic vehicle;
   associating each of the general criteria with the respective identifier to define a general template;
   storing the general template in a memory of a host machine;
   storing exterior surface data of a configuration of a specific vehicle in the memory of the host machine;
   receiving a selection from a user for the exterior surface data of the configuration of the specific vehicle from the memory of the host machine;
   displaying an exterior surface representing the selected exterior surface data of the configuration of the specific vehicle as a three-dimensional configuration on a display device;
   displaying the general template, including the identifiers, on the display device, and
   wherein displaying the exterior surface and displaying the general template occurs at the same time on the display device;
   displaying a plurality of lines or curves on the display device along the exterior surface to represent the exterior surface data for the corresponding location of the exterior surface;
   displaying a glass projection area on the display device over a portion of the exterior surface, and wherein the plurality of lines or curves overlap the glass projection area to allow calculations of the general criteria with the selected exterior surface data;
   trimming one or more of the plurality of lines or curves such that corresponding lines or curves are spaced from each other to create a transition area;
   receiving a selection from the user for one of the identifiers of the general template displayed on the display device and receiving a selection from the user for a desired location of the exterior surface of the specific vehicle displayed on the display device to associate the general criteria for the selected one of the identifiers with the exterior surface data of the selected desired location;
determining interior surface data of the selected desired location, via the host machine, based on the general criteria of the selected one of the identifiers and the exterior surface data of the selected desired location; and
displaying the interior surface representing the interior surface data of the configuration of the specific vehicle corresponding to the general criteria of the selected one of the identifiers and the exterior surface data of the selected desired location on the display device, and wherein displaying the interior surface occurs after displaying the exterior surface and the general template;
wherein the interior surface is not generated in the transition area.

2. A method as set forth in claim 1 wherein displaying the interior surface representing the interior surface data of the configuration of the specific vehicle includes displaying the interior surface as a three-dimensional configuration on the display device.

3. A method as set forth in claim 1 wherein receiving a selection from the user for one of the identifiers and receiving a selection from the user for a desired location includes:
receiving a first selection from the user for a first identifier of the general template displayed on the display device and receiving a first selection from the user for a first desired location of the exterior surface of the specific vehicle displayed on the display device to associate the general criteria for the selected first identifier with the exterior surface data of the selected first desired location, and wherein the first identifier of the general template disappears from the display device after receiving the first selection for the first desired location of the exterior surface of the specific vehicle; and
receiving a second selection from the user for a second identifier of the general template displayed on the display device and receiving a second selection from the user for a second desired location of the exterior surface of the specific vehicle displayed on the display device to associate the general criteria for the selected second identifier with the exterior surface data of the selected second desired location, and wherein the second identifier of the general template disappears from the display device after receiving the second selection for the second desired location of the exterior surface of the specific vehicle.

4. A method as set forth in claim 3 wherein determining interior surface data of the selected desired location includes determining interior surface data of at least one of the first and second desired locations, via the host machine, as a function of the general criteria of at least one of the selected first and second identifiers and the exterior surface data of at least one of the first and second desired locations.

5. A method as set forth in claim 4 wherein determining interior surface data of at least one of the first and second desired locations includes:
determining interior surface data of the first desired location, via the host machine, based on the general criteria of the selected first identifier and the exterior surface data of the first desired location; and
determining interior surface data of the second desired location, via the host machine, based on the general criteria of the selected second identifier and the exterior surface data of the second desired location.

6. A method as set forth in claim 5 wherein displaying the interior surface representing the interior surface data of the configuration of the specific vehicle includes:
displaying the interior surface representing the interior surface data of the first desired location of the configuration of the specific vehicle corresponding to the general criteria of the selected first identifier and the exterior surface data of the first desired location on the display device; and
displaying the interior surface representing the interior surface data of the second desired location of the configuration of the specific vehicle corresponding to the general criteria of the selected second identifier and the exterior surface data of the second desired location on the display device.

7. A method as set forth in claim 5:
further comprising associating the interior surface data of the first desired location and the interior surface data of the second desired location with one another; and
wherein displaying the interior surface representing the interior surface data of the configuration of the specific vehicle includes displaying the interior surface representing the interior surface data of the first and second desired locations of the configuration of the specific vehicle as a three-dimensional configuration on the display device.

8. A method as set forth in claim 5:
wherein determining interior surface data of the first desired location includes calculating the interior surface data of the first desired location from the general criteria of the selected first identifier and the exterior surface data of the selected first desired location; and
wherein determining interior surface data of the second desired location includes calculating the interior surface data of the second desired location from the general criteria of the selected second identifier and the exterior surface data of the selected second desired location.

9. A method as set forth in claim 8 further comprising storing the interior surface data of the first desired location and the interior surface data of the second desired location of the configuration of the specific vehicle in the memory of the host machine.

10. A method as set forth in claim 1 wherein determining interior surface data of the selected desired location includes calculating the interior surface data from the general criteria of the selected one of the identifiers and the exterior surface data of the selected desired location.

11. A method as set forth in claim 10 further comprising storing the interior surface data of the configuration of the specific vehicle in the memory of the host machine.

12. A method as set forth in claim 1 wherein storing exterior surface data of a configuration of the specific vehicle in the memory of the host machine includes:
storing first exterior surface data of a first configuration of the specific vehicle in the memory of the host machine; and
storing second exterior surface data of a second configuration of the specific vehicle in the memory of the host machine.

13. A method as set forth in claim 12 wherein receiving a selection from a user for the exterior surface data of the configuration of the specific vehicle from the memory of the host machine includes receiving a selection from the user for one of the first exterior surface data of the first configuration of the specific vehicle and the second exterior surface data of the second configuration of the specific vehicle from the memory of the host machine.

14. A method as set forth in claim 13 wherein receiving a selection from the user for one of the first exterior surface data and the second exterior surface data includes receiving a selection from the user for the second exterior surface data of the second configuration of the specific vehicle from the memory of the host machine.

15. A method as set forth in claim 14 wherein:
displaying an exterior surface representing the selected exterior surface data of the configuration of the specific vehicle includes displaying a second exterior surface representing the selected second exterior surface data of the second configuration of the specific vehicle as a three-dimensional configuration on the display device;
receiving a selection from the user for one of the identifiers of the general template and receiving a selection from the user for a desired location of the exterior surface of the specific vehicle includes receiving a selection from the user for one of the identifiers of the general template displayed on the display device and receiving a selection from the user for a desired location of the second exterior surface of the specific vehicle displayed on the display device to associate the general criteria for the selected one of the identifiers with the second exterior surface data of the selected desired location;
determining interior surface data of the selected desired location includes determining second interior surface data of the selected desired location, via the host machine, based on the general criteria of the selected one of the identifiers and the second exterior surface data of the selected desired location; and
displaying the interior surface representing the interior surface data of the configuration of the specific vehicle includes displaying a second interior surface representing the second interior surface data of the second configuration of the specific vehicle corresponding to the general criteria of the selected one of the identifiers and the second exterior surface data of the selected desired location on the display device.

16. A method as set forth in claim 15 wherein displaying the second interior surface representing the second interior surface data of the second configuration of the specific vehicle includes displaying the second interior surface as a three-dimensional configuration on the display device.

17. A method as set forth in claim 15 wherein determining second interior surface data of the selected desired location includes calculating the second interior surface data from the general criteria of the selected one of the identifiers and the second exterior surface data of the selected desired location.

18. A method as set forth in claim 17 further comprising storing the second interior surface data of the second configuration of the specific vehicle in the memory of the host machine.

19. A method as set forth in claim 1 wherein the generic vehicle is further defined as a first generic vehicle, the general template is further defined as a first general template, the specific vehicle is further defined as a first specific vehicle and the interior surface is further defined as a first interior surface, the method further comprising:
removing the first interior surface representing the interior surface data of the configuration of the first specific vehicle from the display device;
providing a plurality of identifiers representing components of a second generic vehicle;
providing general criteria for each of the identifiers of the second generic vehicle;
associating each of the general criteria with the respective identifier of the second generic vehicle to define a second general template;
storing the second general template in the memory of the host machine;
storing exterior surface data of a configuration of a second specific vehicle in the memory of the host machine;
receiving a selection from a user for the exterior surface data of the configuration of the second specific vehicle from the memory of the host machine;
displaying an exterior surface representing the selected exterior surface data of the configuration of the second specific vehicle as a three-dimensional configuration on the display device;
displaying the second general template, including the identifiers, on the display device, and wherein displaying the exterior surface of the second specific vehicle and displaying the second general template occurs at the same time on the display device;
receiving a selection from the user for one of the identifiers of the second general template displayed on the display device and receiving a selection from the user for a desired location of the exterior surface of the second specific vehicle displayed on the display device to associate the general criteria for the selected one of the identifiers with the exterior surface data of the selected desired location;
determining interior surface data of the selected desired location, via the host machine, as a function of the general criteria of the selected one of the identifiers and the exterior surface data of the selected desired location of the second specific vehicle; and
displaying the interior surface representing the interior surface data of the configuration of the second specific vehicle corresponding to the general criteria of the selected one of the identifiers and the exterior surface data of the selected desired location on the display device, and wherein displaying the interior surface of the second specific vehicle occurs after displaying the exterior surface of the second specific vehicle and the second general template.

20. A method of generating an interior surface of a vehicle compartment, the method comprising:
storing a general template in a memory of a host machine, with the general template including a plurality of identifiers representing components of a generic vehicle and the general template including general criteria for each of the identifiers of the generic vehicle;
storing exterior surface data of a configuration of a specific vehicle in the memory of the host machine;
receiving a selection from a user for the exterior surface data of the configuration of the specific vehicle from the memory of the host machine;
displaying an exterior surface representing the selected exterior surface data of the configuration of the specific vehicle as a three-dimensional configuration on a display device;
displaying the general template, including the identifiers, on the display device, and wherein displaying the exterior surface and displaying the general template occurs at the same time on the display device;
displaying a plurality of lines or curves on the display device along the exterior surface to represent the exterior surface data for the corresponding location of the exterior surface;

trimming one or more of the plurality of lines or curves such that corresponding lines or curves are spaced from each other to create a transition area;

receiving a selection from the user for one of the identifiers of the general template and receiving a selection from the user for a desired location of the exterior surface of the specific vehicle to associate the general criteria for the selected one of the identifiers with the exterior surface data of the selected desired location, and wherein the selected identifier is removed from the display after selecting the desired location of the exterior surface;

determining interior surface data of the selected desired location, via the host machine, as a function of the general criteria of the selected one of the identifiers and the exterior surface data of the selected desired location; and displaying the interior surface representing the interior surface data of the configuration of the specific vehicle corresponding to the general criteria of the selected one of the identifiers and the exterior surface data of the selected desired location on the display device;

wherein the interior surface is not generated in the transition area.

* * * * *